(12) United States Patent
Gonsalves et al.

(10) Patent No.: US 8,119,392 B2
(45) Date of Patent: Feb. 21, 2012

(54) BIOCOMPATIBLE RESISTS

(75) Inventors: Kenneth E. Gonsalves, Concord, NC (US); Wei He, Atlanta, GA (US)

(73) Assignee: The University of North Carolina at Charlotte, Charlotte, NC (US)

( * ) Notice: Subject to any disclaimer, the term of this patent is extended or adjusted under 35 U.S.C. 154(b) by 895 days.

(21) Appl. No.: 10/835,757

(22) Filed: Apr. 30, 2004

(65) Prior Publication Data

US 2005/0014098 A1 Jan. 20, 2005

Related U.S. Application Data

(60) Provisional application No. 60/466,878, filed on May 2, 2003.

(51) Int. Cl.
*C12M 1/00* (2006.01)
*A61K 47/48* (2006.01)
*A61K 38/06* (2006.01)

(52) U.S. Cl. .............. 435/283.1; 435/325; 525/54.1; 530/331

(58) Field of Classification Search .............. 435/180, 435/325, 395, 396, 283.1; 430/311; 525/54.1; 530/311, 331
See application file for complete search history.

(56) References Cited

U.S. PATENT DOCUMENTS

| | | | |
|---|---|---|---|
| 3,849,137 A | 11/1974 | Barzynski et al. | |
| 4,225,664 A | 9/1980 | Moran et al. | |
| 4,717,513 A | 1/1988 | Lewis et al. | |
| 5,348,656 A | 9/1994 | Podszun et al. | |
| 5,459,021 A | 10/1995 | Ito et al. | |
| 5,750,680 A * | 5/1998 | Kim et al. .............. | 540/200 |
| 5,780,201 A | 7/1998 | Sabnis et al. | |
| 5,945,250 A | 8/1999 | Aoai et al. | |
| 5,965,325 A | 10/1999 | Matsuo et al. | |
| 6,051,678 A * | 4/2000 | Kim et al. .............. | 528/323 |
| 6,232,034 B1 | 5/2001 | Kasai et al. | |
| 6,238,541 B1 | 5/2001 | Sasaki et al. | |
| 6,306,556 B1 | 10/2001 | Matsuo et al. | |
| 6,391,471 B1 | 5/2002 | Hiraoka et al. | |
| 6,420,084 B1 | 7/2002 | Angelopoulos et al. | |
| 6,468,717 B2 | 10/2002 | Kita et al. | |
| 6,468,725 B2 | 10/2002 | Takamuki | |
| 6,479,210 B2 | 11/2002 | Kinoshita et al. | |
| 6,492,086 B1 | 12/2002 | Barclay et al. | |
| 6,512,081 B1 | 1/2003 | Rizzardo et al. | |
| 6,512,958 B1 | 1/2003 | Rizzardo et al. | |
| 6,517,958 B1 | 2/2003 | Sellinger et al. | |
| 6,696,148 B1 | 2/2004 | Seino et al. | |
| 6,716,919 B2 | 4/2004 | Lichtenban et al. | |
| 6,884,562 B1 | 4/2005 | Schadt, III et al. | |
| 2002/0182541 A1 | 12/2002 | Gonsalves | |
| 2003/0146418 A1 | 8/2003 | Chacko | |

FOREIGN PATENT DOCUMENTS

| | | |
|---|---|---|
| EP | 0 473 547 A1 | 8/1991 |
| JP | 06-228086 | 8/1994 |
| JP | 10-221852 | 8/1998 |
| JP | 2000-334881 | 12/2000 |
| WO | WO 0297533 A1 * | 5/2002 |

OTHER PUBLICATIONS

He et al. "Synthesis, characterization and preliminary biological study of poly(3-(tert-butoxycarbonyl)-N-vinyl-2-pyrrolidone)" Biomacromolecules (2003; published on the Web Nov. 27, 2002) 4: 75-79.*
Kim et al. "A novel water develpable photoresist for deep UV lithography" Eur. Polym. J. (1997) 33(8): 1239-1243.*
Kim et al. "Copolymers of camphoosulfonyloxymalemide . . . " Polymer Bull. (1997) 39: 423-430.*
Wu et al. "Novel CA resists with photoacid generator in polymer chain" Proceed. of SPIE (2001) 4345: 521-527.*
Nicolau et al. Blosensors & Bioelectronics (1999) 14: 317-325.*
Ahn, K.D. et al., "Photoacid generating polymers based on sulfonyloxymaleimides and application as single-component resists," *J. Polym. Sci. Polym. Chem. Ed.* 1996, 34(2):183.
Boeckh et al., "Copolymers Prepared by Ring-Opening Polymerization of Cyclic Ketens with Unsaturated Anhydrides," Chem. Abstract of DE 3927811A1, 1991.
Bowden, M.J. and Turner, S.R., "Electronic and Photonic Applications of Polymers," *ACS* Series 218, 1988.
Brainard, R.L., "Resists for next generation lithography," *Microelectronic Engineering*, 2002, article in press, abstract only.
Bruining, M.J. et al., "New biodegradable networks of poly(N-vinylpyrrolidinone) designed for controlled nonburst degradation in the vitreous body," *J. Biomed. Mater. Res.*, 1999, 47(2):189-197.
Canning, J., "Next generation Lithography: When, why and at what cost?" *Microelectric Engineering*, 2002, article in press, abstract only.
Curtis, A. and Wilkinson, C., "Topographical control of cells," *Biomaterials*, 1997, 18(24):1573-1583.
Curtis, A. and Wilkinson, C., "Reactions of cells to topography,," *J. Biomaler. Sci.*, 1998, 9(12):1313-1329.
Darrick, S.H. et al., "Novel protein kinase C inhibitors: α-terthiophene derivatives," *Bioorganic and Medicinal Chemistry Letter*, 1998, 8(19):2695.
Ely, K.R. et al., "Common molecular scaffold for two unrelated RGD molecules," *Protein Engineering*, 1995, 8(8):823-827.
Garnier, F. et al., "Toward intelligent polymers: DNA sensors based on oligonucleotide-functionalized polypyrroles," *Synth. Met.*, 1999, 100(1):89-94.
Godillot, P. et al., "Direct chemical functionalization of as-grown electroactive polypyrrole film containing leaving groups," *Synth. Met.*, 1996, 83(2):117-123.
Gonsalves, K.E. et al., "Organic-inorganic Nanocomposites: Unique Resists for Nanolithography," *Adv. Mater.*, 2001, 13(10):703-714.

(Continued)

*Primary Examiner* — Susan Hanley
(74) *Attorney, Agent, or Firm* — J Clinton Wimbish; Smith Moore Leatherwood LLP

(57) ABSTRACT

This invention relates to biomaterials, biocompatible photoresists, and electroactive photoresists, and methods to engineer the interactions between biomaterials and cells. In one aspect, this invention provides for modifying surface topography through micro-patterning techniques that require no organic solvent development to reveal the lithographic patterns. Cells can be cultured on these surfaces directly and exhibit strong cell alignment features.

6 Claims, 8 Drawing Sheets

OTHER PUBLICATIONS

Gonsalves, K.E. et al., "Combinatorial approach for the synthesis of terpolymers and their novel application as very-high-contrast resists for x-ray nanolithography," *J. Vac. Sci. Technol. B.*, 2000, 18(1):325-327.

Gonsalves,K.E. and Mungara, P.M., "Synthesis and Properties of Degradable Polyamides and Related Polymers," *TRIP*, 1996, 4(1):25.

Haddad et al., "Hybrid Organic-Inorganic Thermoplastics: Styryl-Based Polyhedral Oligomeric Sisesquioxane Polymers," *Macromolecules*, 1996, 29:7302-7304.

He, W. et al., Synthesis, Characterization, and Preliminary Biological Study of Poly,(3-(tert-butoxycarbonyl)-*N*-vinyl-2-pyrrolidone). *Biomacromolecules*, 2003, 4:75-79.

He, W. et al., "Lithography Application of a Novel Photoresist for Patterning of Cells," *Biomaterials*, 2004, 25: 2055.

Hu. Y. et al., "Nanocomposite resists for electron beam nanolithography," *Microelectronic Engineering*, 2001, 56:289-294.

Irvine. D.J. et al., "Nanoscale clustering of RGD peptides at surfaces using Comb polymers," *Biomacromolecules*, 2001, 2(1):85-94.

Ito, H. et al., "Influence of acid generator structure on T-top formation in high-temperature bake processes for environmental stabilization," *Proc. SPIE*, 1995 2438:53-60.

Ito, H. et al., "Annealing Concept for the Design of Environmentally Stable Chemical Amplification Resists" *J. Photopolym. Sci. Technol.*, 1995. 8:505-518.

Jin. S. and Gonsalves, K.E., "Functionalized copolymers and their composites with polylactide and hydroxyapatite," *J. Mater. Sci. Med.*, 1999, 10(6):363-368.

Jin, S. and Gonsalves. K.E., "Synthesis and Characterization of Functionalized Poly(c-caprolactone) Copolymers by Free-Radical Polymerization," *Macromolecules*, 1998, 31(4):1010-1015.

Kam. L. et al., "Selective adhesion of astrocytes to surfaces modified with immobilized peptides," *Biomaterials*, 2002, 23(2):511-515.

Kirby, S.D. et al., "Nonlinear, three-dimensional finite-element model of skin biomechanics", *J. Otolaryngol.*, 1998, 27(3):153-160.

Korenkov, M. et al., "Biomechanical and morphological types of the linea alba and its possible role in the pathogenesis of midline incisional hernia," *Eur. J. Surg.*, 2001, 167(12):909-914.

Leboucher-Durand et al.. "4-Carboxy-2-Oxetanone as a New Chiral Precursor in the Preparation of Functionalized Racemic or Optically Active Poly(malic acid) Derivatives," Chem. Abstract of *Polymer Bulletin* (Berlin), 1996, 36(1).

Lipton, S. et al., "A biomechanical study of the aponeurotic inguinal hernia repair," *J. Am. Coll. Surg.*, 1994, 178(6):596-599.

Maganaris, C.N., "Tensile properties of in vivo human tendinous tissue," *J. Biomech.*, 2002, 35(8):1019-1027.

Matyjaszewi, K. et al., "Synthesis of Functional Polymers by Atom Transfer Radical Polymerization," ACS Symposium Series 704, Patil et al. (eds.), 1997, pp. 16-27.

Merhari, L. et al., "Nanocomposite resist systems for next generation lithography," *Microelectronic Engineering*, 2000, article in press, abstract only.

Mooney, D.J. et al., "Long-term engraftment of hepatocytes transplanted on biodegradable polymer sponges," *J. Biomed. Mater. Res.*, 1997, 37(3):413-420.

Mudera, V.C. et al., "Molecular responses of human dermal fibroblasts to dual cues: contact guidance and mechanical load," *Cell Motil. Cytoskelelon*, 2000, 45:1-9.

Pan, C.Y. and Wang, Y.J., "Synthesis and polymerization of 2-butyl-7-methylene-1,4,6-trioxaspiro(4,4) nonane," *Polym. Sci. Chem. Ed.*, 1988, 26(20)2737.

Perseo, G. et al., "Synthesis and preliminary biological investigations of O-sulphated dermorphin," *Int. J. Peptide Protein Res.*, 1983, 21(5):471-474.

Pierschbacher, M.D. and Ruoslahti, E., "Cell attachment activity of fibronectin can be duplicated by small synthetic fragments of the molecule," *Nature*, 1984, 309(5963):30-33.

Pyun et al., Chemical Abstract for "Synthesis of Organic/Inorganic Hybrid Materials from Polysiloxane Precursors Using Atom Transfer Radical Polymerization," *Polymer Preprints*, 1999, 40(2):454-455.

Rajnicek. "Guidance of CNS growth cones by substratum grooves and ridges: effects of inhibitors of the cytoskeleton, calcium channels and signal transduction pathways," *J. Cell Sci.*, 1997, 110(23):2915-2924.

Saito, S., "A new positive electron-beam resist material composed of catechol derivatives," *Microelectronic Engineering*, 2002, article in press.

Saltzman, W.M., "Cell interactions with polymers": in *Principles of Tissue Engineering*, Lanza. P.P. et al (eds.), Academie Press. New York: 2000.

Shastri. V. et al., "Application of Conductive Polymers in Bone Regeneration," *Mater. Res. Soc. Symp. Proc.*, 1999, 550:215.

Singhvi, R. et al., "Effects of substratum morphology on cell physiology," *Biotechnol. Bioeng.*, 1994, 43(8):764.

Stingl, J. et al., "Morphology and some biomechanical properties of human liver and spleen," *Surg. Radiol. Anat.*, 2002, 24(5):285-289.

Storch, M. et al., "A 28-day study of the effect of Coated VICRYL Plus Antibacterial Suture (coated polyglactin 910 suture with triclosan) on wound healing in guinea pig linear incisional skin wounds," *Surg. Infect. (Larchmt.)*, 2002, 3(1):89-98.

Thackeray, J.W. et al., "Developmentally regulated alternative splicing generates a complex array of *Drosophila para* sodium channel isoforms," *J. of Neuroscience*, 1994, 14(5 pt 1):2569-2578.

Von Recum, A.F. et al., "Surface Roughness, Porosity, and Texture as Modifiers of Cellular Adhesion," *Tissue Eng.*, 1996, 2:241.

Walboomers, X.F. et al., "Attachment of fibroblasts on smooth and microgrooved polystyrene," *J. Biomed. Mater. Res.*, 1999, 46(2):212-220.

Wallraff, G.M. and Hinsberg, W.D., "Lithographic Imaging Techniques for the Formation of Nanoscopic Features," *Chem. Rev.*, 1999, 99(7):1801-1822.

Wu et al.. "*Chemical Abstract for 'Polymer-Inorganic High Contrast and High Sensitivity Resists for Nanolithography*," Materials Research Society Symposium Proceedings, 2000, 584:121-128.

Wu, H. et al., "Incorporation of polyhedral oligosilsesquioxane in chemically amplified resists to improve their reactive ion etching resistance." *J. Vac. Sci. Technol. B.*, 2001,19(3):851-855.

Wu, H. et al., "Synthesis and Characterization of Radiation-sensitive Polymers and Their Application in Lithography," Ph.D. dissertation. University of Connecticut, Apr. 2001.

Wu, H. et al., "Preparation of a Photoacid Gerating Monomer and its Application in Lithography," *Advanced Functional Materials*, 2001, 11(4):271-276.

Wu, H. et al., "A Novel Single-Component Negative Resist for DUV and Electron Beam Lithography," *Advanced Functional Materials*, 2001, 13(3):195-197.

Yamaoka, T. et al.. "Synthesis and properties of malic acid-containing functional polymers," *Inter. J. Biological Macromolecules*, 1999, 25(1-3):265-271.

Yuan. J.Y. and Pan, C.Y., "Block copolymerization of 5,6-benzo-2-methylene-1,3-dioxepane with conventional vinyl monomers by ATRP method," *European Polymer J.*, 2002. 38(8):1565-1571, 2069-2076.

Chemical abstract for JP 10-221852 (Aogo et al.)—Access No. 1998:545694.

Chemical abstract (AN 1992:408654)—English abstract for EP 473547 (Steinmann et al).

Chemical abstract (AN 1995:198693)—English abstract for JP 06-228086 (Muraoka et al).

Chemical abstract 119:96450—English abstract for JP 5-086133 (Akashi et al.).

English abstract for JP 2000-334881 (Kita et al.) provided by Japan patent office, 2000.

Full, formal English translation of JP 6-228086 (Muraoka et al.) provided by PTO.

JPO Abstract—English abstract for JP 06-228026 (Muraoka et al.).

* cited by examiner

BIOCOMPATIBLE RESISTS

PRIOR RELATED U.S. APPLICATION DATA

This application claims priority to U.S. patent application Ser. No. 60/466,878, filed May 2, 2003, which is incorporated herein by reference in its entirety.

STATEMENT OF GOVERNMENT LICENSE RIGHTS

This invention was sponsored in part through the support of the North Carolina North Carolina Biotechnology Center Grant # 2002-IDG-1016.

TECHNICAL FIELD OF THE INVENTION

This invention relates to the field of tissue engineering and biomaterials, including biocompatible materials that promote cell growth.

SEQUENCE LISTING

The sequence listing in the text file seqlist2.txt seqlist3.txt created on Jul. 19, 2011 and having a size of 749 bytes is incorporated herein by reference.

BACKGROUND OF THE INVENTION

Tissue engineering using autologous, allogeneic, or xenogeneic cells in combination with biocompatible materials provides one of the more promising treatments for tissue loss or end-stage organ failure. Cell transplantation faces many challenges however, including providing an adequate cell source, immunoprotection of the transplanted cells, creation of a vascular bed to support and maintain long-term cell survival, and biocompatibility (both in vitro and in vivo) of the material substrate for the delivery of the cells.

In order for a biomaterial to be successfully integrated in vivo for the creation of new tissue, the ability of a substrate to support cellular attachment, promote the growth and differentiation of stroma and parenchymal cells, induce a minimal inflammatory response, and be biodegradable could be useful. Thus, the development of scalable processes to create three-dimensional patterning on materials are needed that will allow for the selective integration of different cell adhesion peptides to possibly permit selective adhesion of various cells to specific areas of the material. Such spatial organization to guide the development of the tissues in an organized fashion might be achieved by micropatterning of proteins on the substrates.

Micropatterning a biomaterial into microscale or nanoscale features to provide topographical cues for cell alignment may also be needed for engineering nerve cells to direct the axons to their intended location. Thus, micropatterned grooves can play a role in directing the extending axon projection to the area of intended innervation. Extracellular voltage gradients are a normal environmental component in the developing nervous system, thus electroactive (electrically conductive) biomaterials, including biodegradable materials, may also play a role in the formation and regeneration of nerve cells.

One approach to micropatterning is conventional lithography that has been widely used in the semiconductor industry. In conventional lithography, organic solvents are normally utilized to dissolve the photoresist in order to form the desired pattern (See, for example: Moreau, W. M. Semiconductor Lithography: Principles, Practices, and Materials, Plenum, New York, 1987, which is incorporated herein by reference in its entirety). However, such a process can lead to the denaturation of biomolecules and cells. What is needed are new photoresist materials and methods that are biocompatible. If possible, desirable bio-photoresist, or "bioresist", materials, could be used in a conventional lithographic process without using organic solvents or harsh bases for development of the patterned image, yet still allow sub-micron to nanometer scale patterning.

SUMMARY OF THE INVENTION

In one aspect, the present invention provides new bioresist materials and methods that incorporate biocompatible compounds and polymers, and support cellular attachment and growth in an organized fashion. These bioresist materials can be used in conventional lithographic processes, but without using organic solvents or harsh bases for development of the micropatterned and nanopatterned image. Thus, the bioresist materials of this invention allow for easy removal of the photoresist after applying the photolithographic pattern to the surface, without requiring harsh chemical treatment that can be detrimental to amino acids and cells that are being patterned on the surface. In another aspect, the bioresists of this invention are biodegradable.

In one aspect of this invention, the present invention provides a chemically-amplified resist that can comprise the polymerization product of:
a pyrrolidone component comprising at least one pyrrolidone-containing monomer; and
an optional methacrylate component comprising at least one methacrylate-containing comonomer;
wherein the chemically-amplified resist is biocompatible. Thus, in an embodiment, the present invention provides a chemically amplified resist that can comprise the polymerization product of pyrrolidone component comprising at least one pyrrolidone containing monomer, wherein the chemically amplified resist is biocompatible. Moreover, in an embodiment wherein the methacrylate component is present, the present invention provides a chemically amplified resist that can comprise the polymerization product of a pyrrolidone component comprising at least one pyrrolidone-containing monomer and a methacrylate component comprising at least one methacrylate-containing comonomer, wherein the chemically amplified resist is biocompatible.

In another aspect, the pyrrolidone component of this chemically-amplified resist can comprise 3-(t-butoxycarbonyl)-N-vinyl-2-pyrrolidone (TBNVP). Further, this polymerization product can be functionalized with an amino acid, a peptide, or a polypeptide. In yet another aspect, this biocompatible chemically-amplified resist can further comprise the polymerization product of an amino acid component, wherein the amino acid component can comprise at least one compound of the formula

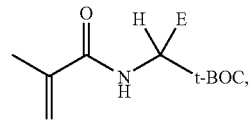

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen.

In another aspect, the present invention provides a chemically-amplified resist comprising the polymerization product of:
a cyclic component comprising 2-methylene-1,3-dioxepane (MDO) having the formula

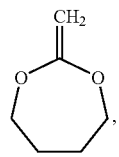

a substituted analog thereof, or a combination thereof; and a vinyl component comprising at least one vinyl-containing comonomer of the formula $CH_2=CHR$, having from 3 to about 20 carbon atoms;

wherein the chemically-amplified resist is bioresorbable. In this aspect, the vinyl component can comprise, for example, a compound of the formula $CH_2=CHR$, wherein R is selected from

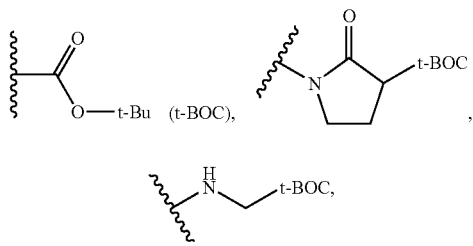

or any combination thereof. This chemically-amplified resist can further comprise the polymerization product of an amino acid component comprising at least one compound of the formula

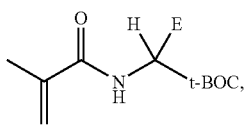

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen. In addition, this chemically-amplified resist can further comprise the polymerization product of a crosslinkable component, at least a portion of which can be crosslinked.

In still another aspect, the chemically-amplified resist of this invention can comprise the polymerization product of:

an amino acid component comprising at least one compound of the formula

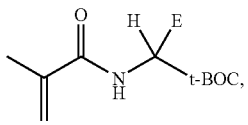

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen.

Another aspect of this invention is a chemically-amplified resist comprising the product resulting from the ring-opening polymerization and hydrogenolysis of

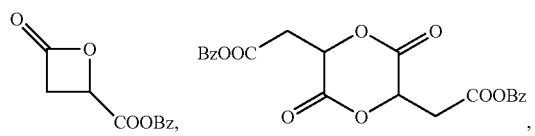

or any combination thereof; wherein Bz is benzyl. In this aspect, for example, this invention provides a chemically-amplified resist comprising a polymer, wherein the polymer comprises moieties selected from:

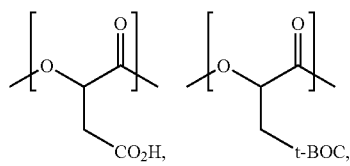

or any combination thereof.

In a further aspect, this invention provides a method of making a 3-dimensional bioresist, comprising a) copolymerizing:
1) a cyclic component comprising 2-methylene-1,3-dioxepane (MDO), a substituted analog thereof, or a combination thereof;
2) a crosslinkable component, wherein the crosslinkable component comprising at least one compound having the formula:

$CH_2=CH(CH_2)_nCH=CH_2$, wherein n is an integer from 0 to about 12;

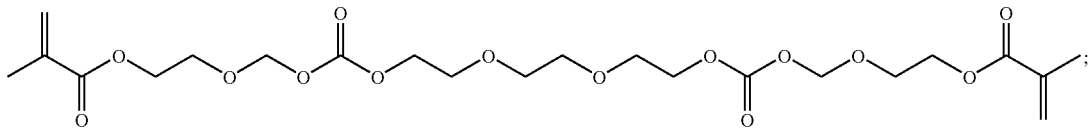

or any combination thereof;
3) an optional vinyl component comprising at least one vinyl-containing comonomer of the formula $CH_2=CHR$, having from 3 to about 20 carbon atoms; and
4) an optional amino acid component comprising at least one compound of the formula

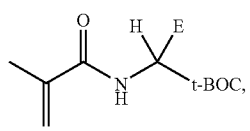

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen; in solution to form a biocompatible chemically-amplified resist;

b) providing a gas to the solution; and c) crosslinking the crosslinkable component of the chemically-amplified resist.

In still a further aspect, this invention provides a method of making a 3-dimensional bioresist, comprising
  a) providing a substrate comprising pillared arrays;
  b) forming a first coating on the substrate, wherein the first coating comprises a biodegradable polymer;
  c) curing the first coating;
  d) forming a second coating on the first coating, wherein the second coating comprises a biocompatible resist;
  e) exposing the second coating to radiation to form a pattern;
  f) developing the pattern; and
  g) optionally removing the combined first coating and second coating from the substrate to form a 3-dimensional bioresist.

The present invention further provides for biocompatible resists that can be bioelectroactive resists, typically comprising the polymerization product of:
  a pyrrole component comprising at least one pyrrole-containing monomer, each of which is optionally functionalized with at least one t-butoxycarbonyl group; and
  an amidopyrrole component comprising at least one amidopyrrole-containing comonomer;
  wherein the resist is biocompatible. In this aspect, the amidopyrrole-containing comonomer can be further functionalized with an amino acid, a peptide, or a polypeptide.

Another type of bioelectroactive resist encompassed by this invention is a resist comprising:
  at least one pyrrole component, each comprising the polymerization product of at least one pyrrole-containing monomer, wherein each pyrrole-containing monomer is optionally functionalized with at least one t-butoxycarbonyl group; and
  at least one chemical spacer separating the pyrrole components comprising from about 3 to about 30 carbon atoms.

Yet another type of bioelectroactive resist the present invention provides is a resist comprising the polymerization product of:
  a thiophene component comprising at least one thiophene-containing oligomer, wherein the oligomer comprises a polymerizable moiety;
  a cyclic component comprising 2-methylene-1,3-dioxepane (MDO), a substituted analog thereof, or a combination thereof; and
  a vinyl component comprising at least one vinyl-containing comonomer of the formula $CH_2=CHR$, having from 3 to about 20 carbon atoms;
  wherein the resist is biocompatible. In this aspect, for example, the vinyl component comprises $CH_2=CHR$, wherein R is selected from

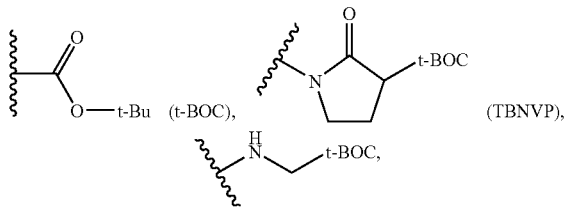

N-vinyl-2-pyrrolidone (NVP), t-butyl methacrylate, methyl methacrylate, methacrylic acid, or any combination thereof.

For the resists disclosed herein, the present invention further provides a three-dimensional structure comprising the disclosed resist, and also provides that the resist that can further comprise mammalian cells. This invention also provides a lithographic process comprising:
  exposing a lithographic recording medium to radiation to form a pattern; and
  developing the pattern;
  wherein the lithographic recording medium comprises the resists disclosed herein.

These and other features, characteristics, and aspects of the present invention will become apparent after a review of the following detailed description, which includes a detailed description of the embodiments of this invention.

DETAILED DESCRIPTION OF THE INVENTION

The present invention provides new bioresist materials and methods that incorporate biocompatible compounds and polymers, and support cellular attachment and growth in an organized fashion. These bioresist materials generally allow for easy removal of the photoresist after applying the photolithographic pattern to the surface, without requiring harsh chemical treatment that can be detrimental to amino acids and cells that are being patterned on the surface. The present invention also provides new bioelectroactive resist materials that incorporate conducting domains along with biocompatible compound and polymer segments, that find particular utility in the growth and regeneration of nerve cells.

In one aspect this invention also can provide for new bioresist materials and methods, including electroactive bioresists, that can allow for cell adhesion, alignment, viability, and scalability. In this aspect, this invention can provide for developing new materials and methods for tissue engineering and for organized tissue growth and guided tissue regeneration. This invention may also provide for materials and methods that allow cells to adhere, or not adhere, to chemically-defined surfaces. In another aspect, this invention may provide for materials and methods that can be used in conventional sub-micron to nanometer scale lithographic processes without using organic solvents or harsh bases for developing the patterned image. The present invention can also provide for scalable methods and processes for tissue engineering and for organized tissue growth.

Functionalized Biocompatible Resists and Structures

In one aspect, this invention provides a new approach toward the patterning of biomolecular layers using new photoresist materials. These materials allow for the easy removal of the photoresist after applying the photolithographic pattern to the surface. Unlike conventional lithography, the removal of the photoresist using this scalable technique, does not require harsh chemical treatment that can be detrimental to amino acids and cells that are being patterned on the surface.

Figure 1:
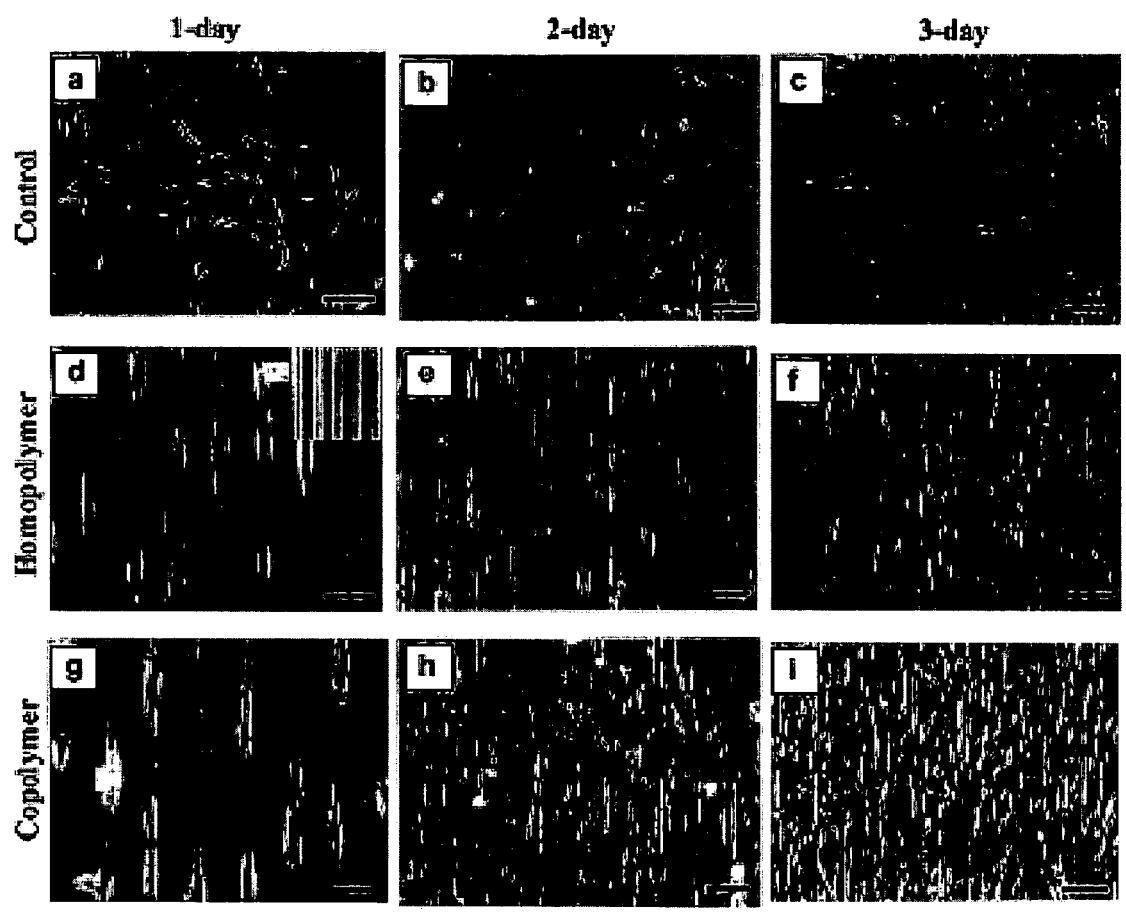
FIG. 1 provides optical micrographs of fibroblast cells cultured on plain glass (a-c) and patterned surfaces obtained from the homopolymer (d-f) and the copolymer (g-i), where homopolymer and copolymer refer to a homopolymer of 3-(t-butoxycarbonyl)-N-vinyl-2-pyrrolidone (TBNVP) and its copolymer with methyl methacrylate (MMA:TBNVP). Micrographs were recorded after 24 hr (a,d,g); 2 days (b,e,h); and 3 days (c,f,i) incubation in serum containing medium (bar=100 μm).

As illustrated in FIG. 1, glass or plastic substrates were used to create the patterned surfaces using test polymers, which were then seeded with rat fibroblast cells to determine whether the material processing was toxic to the cells and if cell adhesion and alignment would occur in relationship to the patterned surface. The pyrrolidone monomer 3-(t-butoxycarbonyl)-N-vinyl-2-pyrrolidone (TBNVP) 1 was synthesized as shown in Scheme 1, and the homopolymer of 3-(t-butoxycarbonyl)-N-vinyl-2-pyrrolidone (TBNVP) and its copolymer with methyl methacrylate (MMA:TBNVP) 5 were prepared as disclosed in the Examples. These polymeric materials were characterized by gel permeation chromatography (GPC), Fourier transform infrared spectroscopy (FTIR), $^1$H and $^{13}$C nuclear magnetic resonance (NMR), and thermal analysis methods. These polymers were particularly useful because the t-butoxycarbonyl (t-BOC) group allowed these polymers to be used as chemically amplified photoresists (CAR) when a photoacid generator (PAG) is applied. Further, the copolymer compositions can be optimized for film formation, physical and mechanical properties, and for the development of features without the use of a strong base.

Scheme 1

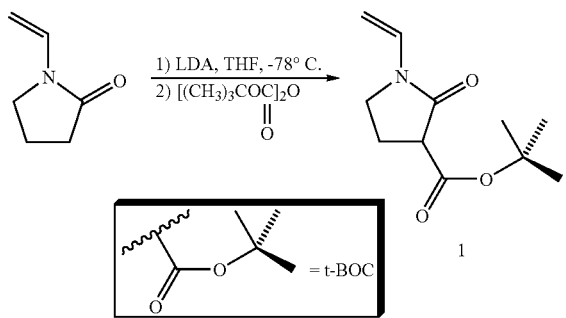

For example, the homopolymer was used as a chemically-amplified resist (CAR) for photoimaging, as illustrated in Scheme 2. The specific underlying chemistry is the conversion of the material from hydrophobic (2) to hydrophilic (3), which on development can be patterned based on the mask and projection system. Alternatively, on thermal processing 2 is converted to PVP (4).

To test these resist materials, a triarylsulfonium salt, such as triphenylsulfonium hexafluoroantimonate, triphenylsulfonium triflate, or a combination thereof, was employed as the photoacid generator (PAG). Covalent organic PAGs such as these can produce H$^+$ upon absorbing UV light. Other PAGs that can be used in this invention include, but are not limited to, those disclosed in Ahn, K. D., Koo, J. S. and Chung, C. M. *J Polym Sci Polym Chem Ed* 1996, 34, 183; Thackeray, J. W., Adams, T., Cronin, M. F., Denison, M., Fedynyshyn, T. H., Georger, J., Mori, J. M., Orsula, G. W. and Sinta, R. *J Photopolym Sci Technol* 1994, 7, 619-630; Ito, H., Breyta, G., Hofer, D., Fisher, R. and Prime, B. *Proc SPIE* 1995, 2438, 53-60; Ito, H., Breyta, G., Sooriyakumaren, R. and Hofer, D. *J Photopolym Sci Technol* 1995, 8, 505-518; each of which is incorporated herein by reference in its entirety.

Scheme 2

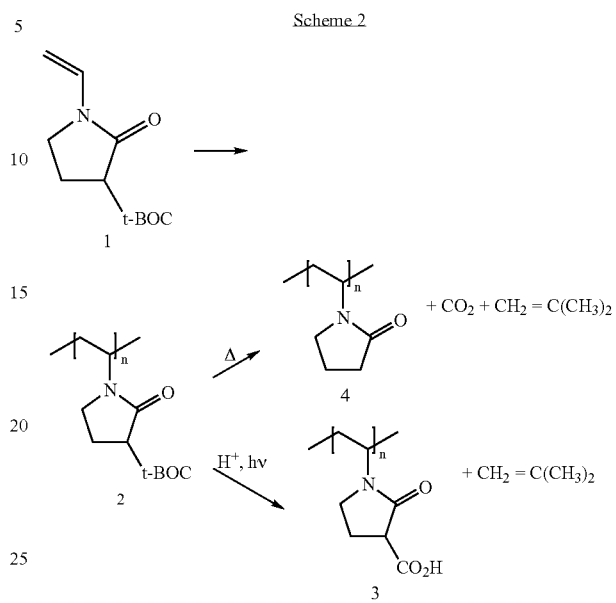

When acid is generated upon irradiating the PAG with UV light, the acid deblocks the t-BOC groups resulting in a change in the hydrophobicity and chemistry between the exposed and unexposed areas of the resist material. Arrays of lines with 25 μm width and 25 μm spacing were successfully patterned with both the homopolymer and the copolymer using UV lithography. In one aspect, following UV exposure of the MMA:TBNVP copolymer resists, no further development with harsh organics and strong bases is required to reveal the lithographic patterns. The copolymer of 3-(t-butoxycarbonyl)-N-vinyl-2-pyrrolidone (TBNVP) 1 with methyl methacrylate (MMA:TBNVP) is presented as structure 5.

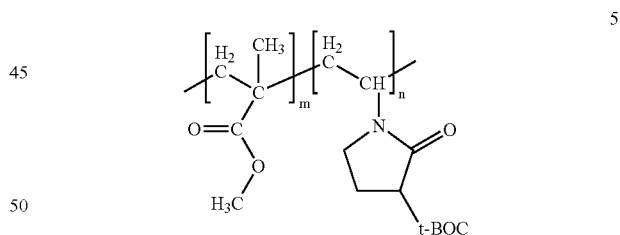

Rat fibroblast cells were seeded on these patterned surfaces at a density of 150,000 cells/sample and cultured up to 3 days. Cells were also cultured on regular glass slides as a control. As illustrated in FIG. 1a, after 1 day of culturing, cells had a very flattened appearance on the untreated glass slide, and they were spindle-shaped and randomly distributed over the surface. In contrast, rat fibroblast cells that were seeded on the patterned polymer substrate (FIGS. 1d and 1g), were observed to adhere and spread on the surface, indicating that the polymers are non-toxic and biocompatible. Moreover, cells were strongly aligned and elongated along the engineered grooves, and became bipolar.

The total time of the in vitro experiment was 3 days. As shown in FIG. 1, cells were still attached and appeared to be proliferating on both the smooth and the micropatterned surfaces after 2 and 3 days of incubation. On the smooth surfaces (FIGS. 1b and 1c), the stellate fibroblast cells were growing randomly, while on the patterned surfaces, the main vector of orientation seemed to be directed parallel to the lines and the shape of the cells were elongated as compared to the control. By the second day, the cells still appeared to be oriented along the grooves. However, cells were able to bridge the gaps and form contacts with cells that were aligned on the parallel grooves. This feature was evident by the third day in culture, and it possibly could be due to the short distance of the spaces between the grooves.

These results demonstrate one potential application of this bioresist technique in combination with 3-D bioresorbable constructs to produce an oriented, tissue-like structure from fibroblasts, which will have desirable mechanical strength and flexibility similar to that of normal tissue. It is possible that the ability to control cell orientation will be useful for the development of advanced forms of tissue repair and cell engineering therapies, for example, peripheral nerve repair, production of tendon and ligament substitutes in vitro, and the control of microvascular repair. See: Mudera, V. C., Pleass, R., Eastwood, M., Tarnuzzer, R., Schultz, G., Khaw, P., McGrouther, D. A. and Brown, R. A. *Cell Motil. Cytoskeleton* 2000, 45, 1; which is incorporated herein by reference in its entirety. The bioresist materials and methods of the presnt invention are non-toxic, and additionally provide COOH groups on the biomaterial itself that can be further used for modification of the surfaces with cell adhesion peptides.

While not intending to be bound by theory, cell alignment along the grooves could arise from one or more of several possible factors. Because of the different chemistry associated with the polymer that formed the grooves, one possible mechanism for selective cell adhesion could be related to preferential protein absorption. See, for example: Saltzman, W. M. *Cell interactions with polymers* in Principles of Tissue Engineering; Lanza, P. P., Langer, R., Vacanti J. Eds.; Academic Press: New York, 2000; which is incorporated herein by reference in its entirety. In this aspect, it is possible that fibronectin and vitronectin that are in the serum could have preferentially coated the surface along the grooves, hence, cells could possibly adhere to the surface through an integrin-ligand interaction. To assess the effect of serum components on the alignment phenomenon, we exposed cells to the patterned samples in the absence of serum proteins. Under such condition, cells did attach on both plain and patterned surfaces, but they were rounded in shape and did not spread on the surface. In addition, the number of cells that attached to the surface was less than in the presence of serum. Again, while not intending to be bound by theory, such results suggest that preferential protein absorption is likely to affect cell attachment in this study.

It is also possible that cell alignment along the grooves could result largely from another factor, that is, the surface free energy being more suitable for cell adhesion along the groove surface. Again, while not intending to be bound by theory, similar phenomenon have been reported to influence cell behavior on material surfaces; see: Saltzman, W. M. *Cell interactions with polymers* in Principles of Tissue Engineering; Lanza, P. P., Langer, R., Vacanti J. Eds.; Academic Press: New York, 2000.

While not intending to be bound by theory, yet another potential mechanism that could lead to cell alignment along the grooves is contact guidance. The microtexture of a substrate surface can influence the behavior of the cells growing on such substrates in vitro. See, for example: Singhvi, R., Stephanopoulos, G. and Wang, D. I. C. *Biotechnol Bioeng* 1994, 43, 764; Von Recum, A. F., Sgabbib, C. E., Cannon, E. C., Long, K. J., Van Kooten, T. G. and Meyle, J. *Tissue Eng* 1996, 2, 241; Curtis, A., Wilkinson, C. *Biomaterials* 1997, 18, 1573-1583; and Curtis, A., Wilkinson, C. *J. Biomater. Sci.* 1998, 9, 1313-1329; each of which is incorporated herein by reference in its entirety. Many cell types, such as fibroblasts, neurons, osteoblasts and macrophage-like cells, recognize these surface features and react accordingly, possibly by reshaping the actin filaments in their surface-probing structures. Again, while not intending to be bound by theory, it has been proposed that the dynamics of actin polymerization could explain contact guidance. See: Walboomers, X. F., Croes, H. J. E., Ginsel, L. A. and Jansen, J. A. *Biomaterials* 1998, 19, 1861-1868; Walboomers, X. F., Monaghan, W., Curtis, A. S. G. and Jansen, J. A. *J Biomed Mater Res* 1999, 46, 212-220; each of which is incorporated herein by reference in its entirety.

In another aspect, this invention provides for bioresists in which some or all of the t-BOC groups have been deprotected that are useful materials for supporting cellular adhesion. In this aspect, the interaction of fibroblast cells with the MMA:TBNVP copolymer before and after deprotection of the t-BOC groups was examined. Cells were cultured on both MMA:TBNVP and MMA:D-TBNVP (deprotected copolymer) surfaces for 2 h and 6 h, respectively, and the number of cells attached was determined by measuring the absorbance at 490 nm obtained by the MTT assay. Thus, 2 h after the cells were seeded onto the materials, there was minimal cell attachment on the MMA:TBNVP and MMA:D-TBNVP surfaces as compared to the plain glass surface. When the incubation time was increased to 6 h, the absorbance was significantly ($p<0.05$) increased on MMA:D-TBNVP samples versus the MMA:TBNVP samples.

While not intending to be bound by theory, this observation could be due to the COOH groups presented on the MMA:D-TBNVP surfaces. Further, the observed differences in cell adhesion could also be influenced by the different surface chemistries of the materials. After deprotection of the t-BOC groups, the surface of the MMA:D-TBNVP should be more hydrophilic and characterized by a different charge density.

Figure 2:
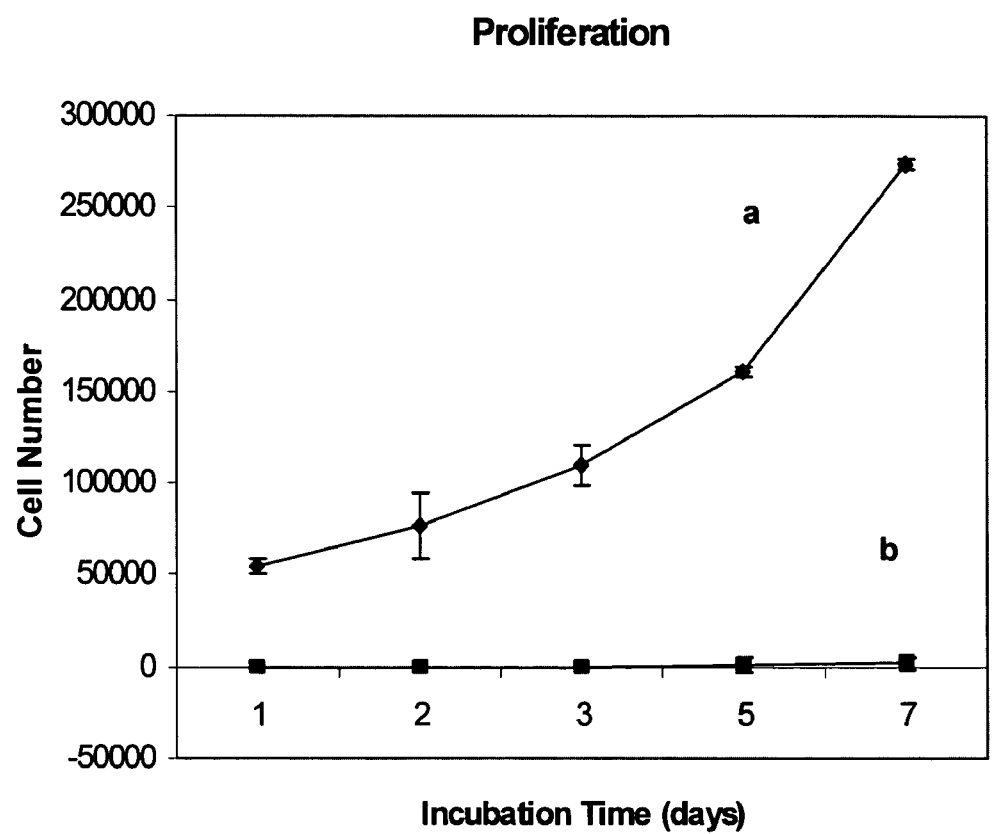
FIG. 2 provides a plot of incubation time versus cell number, to illustrate fibroblast proliferation (mean±SD, n=3) in direct contact with the copolymer MMA:D-TBNVP (a) and untreated polystyrene (b) evaluated by MTS assay up to 7 days. (MMA:D-TBNVP is the copolymer of MMA and deprotected TBNVP, 3-(carboxylic acid)-N-vinyl-2-pyrrolidone.)

In yet another aspect, this invention provides for bioresists in which some or all of the t-BOC groups have been deprotected, that are useful materials for supporting cellular adhesion and cell proliferation. In this aspect, the growth behavior of fibroblasts on MMA:D-TBNVP is shown in FIG. 2, which provides a plot of incubation time versus cell number, to illustrate fibroblast proliferation (mean±SD, n=3) in direct contact with the copolymer MMA:D-TBNVP as compared to untreated polystyrene. As shown the cells not only attached on the surface, but also proliferated. There was a longer lag time on the MMA:D-TBNVP versus the control (fibroblast cells seeded on tissue culture treated polystyrene normally have a 1 day lag time), but despite the lag time, cells grew to a similar level as the control. As further demonstrated in the Examples, the surface properties of these bioresist materials can be modified to support specific cellular adhesion and growth properties by functionalizing the bioresist with cell adhesion amino acids, peptides, polypeptides, and proteins.

Figure 3:
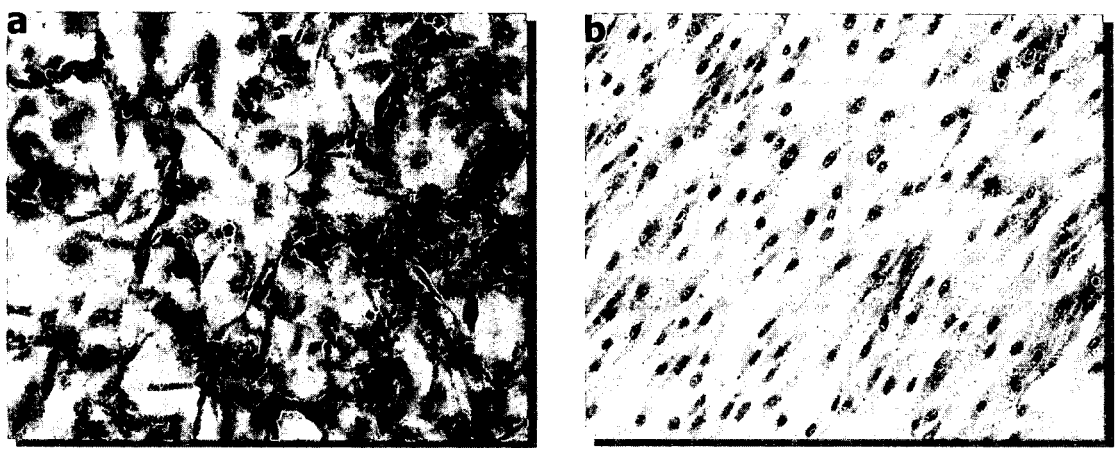
FIG. 3 illustrates a Masson's Trichrome stain (blue dye) for collagen deposition on (a) control and (b) patterned surfaces after 2 weeks of culture (200× magnification), using copolymer MMA:TBNVP.

In still another aspect, this invention provides for the preparation and utility of free-standing patterns comprising biomaterials (line-space 25 μm×25 μm) of the copolymer MMA:TBNVP on a crosslinked biocompatible substrate. In this aspect, for example, a 2-in glass substrate was patterned with the copolymer MMA:TBNVP and used to achieve fibroblast cell alignment. Cell proliferation was observed over the entire patterned surface area (He and Gonsalves, 2003). A non-tissue culture treated plastic well was used as a control. The fibroblast cells were grown for 2 weeks at 37° C. in a humidified chamber and the materials were removed from culture and exposed to Z-fix formalin for subsequent fixation. The materials were then stained with Masson's Trichrome that stains collagen blue; FIG. 3 shows the control (a) and the patterned surface (b) on these materials. As shown, the control had a random appearance of cell growth with very little collagen deposition on the surface, compared to the patterned surface that had a well-defined matrix deposition pattern that appears to be oriented along the patterned surface.

Thus, in one aspect, the present invention provides a chemically-amplified resist that can comprise the polymerization product of:
a pyrrolidone component comprising at least one pyrrolidone-containing monomer; and
an optional methacrylate component comprising at least one methacrylate-containing comonomer;
wherein the chemically-amplified resist is biocompatible. The pyrrolidone component of this chemically-amplified resist can comprise 3-(t-butoxycarbonyl)-N-vinyl-2-pyrrolidone (TBNVP). Moreover, other organic moieties comprising a polymerizable vinyl group and t-Boc functionality may serve as monomers in generating a polymeric chemically-amplified resist.

In another aspect, some or all of the t-butoxycarbonyl groups of the 3-(t-butoxycarbonyl)-N-vinyl-2-pyrrolidone can be deprotected to form carboxylic acid groups. In this aspect for example, the deprotected or partially deprotected, carboxylic acid-functionalized bioresist can be further functionalized with bioactive components such as amino acids, peptides, polypeptides, or proteins, and the like.

Thus, in one aspect, the surfaces of the bioresists of this invention may be chemically-modified or functionalized with bioactive components, including but not limited to, bioactive peptides. While not intending to be bound by theory, this strategy may provide a method for directing and controlling cell-biomaterial interactions with degree of selectivity. (See, for example: Kam, L., Shain, W., Turner, I. N., and Bizios, R. *Biomaterials* 2002, 23, 511-515; which is incorporated herein by reference in its entirety.) The tripeptide sequence Arg-Gly-Asp (RGD) has been reported as the minimal common sequence involved in adhesive proteins such as fibronection; see Pierschbacher, M. D. and Ruoslahti, E. *Nature* 1984, 309, 30-33; which is incorporated herein by reference in its entirety. Further, the RGD tripeptide sequence has been identified as important for recognition of cell adhesion proteins by cell surface receptors (integrins), and is know to be present in a number of proteins including fibronectin, vitronectin, von Willebrand factor and fibrinogen; see: *Protein Engineering*, by Ely, K. R., Kunicki, T. J., and Kodandapani, R., Vol 8, 823-827, 1995; which is incorporated herein by reference in its entirety. See also: Mooney, D. J., Sano, K., Kaufmann, P. M., Majahod, K., Schloo, B., Vacanti, J. P. and Langer, R. *J Biomed Mater Res* 1997, 37, 413-420; and Irvine, D. J., Mayes, A. M., Griffith, L. G. *Biomacromolecules* 2001, 2, 85-94; each of which is incorporated herein by reference in its entirety, for various cell attachment studies.

Thus, in one aspect, peptide sequences, including, but not limited to, the RGD tripeptide sequence, can be coupled to the materials through functional groups such as carboxyl groups (—COOH). In another aspect, the present invention provides a chemically-amplified resist comprising the polymerization product of:
a pyrrolidone component comprising at least one pyrrolidone-containing monomer; and
an optional methacrylate component comprising at least one methacrylate-containing comonomer;
wherein the chemically-amplified resist is biocompatible,
wherein the pyrrolidone component comprises 3-(t-butoxycarbonyl)-N-vinyl-2-pyrrolidone (TBNVP), wherein some or all of the t-butoxycarbonyl groups of the 3-(t-butoxycarbonyl)-N-vinyl-2-pyrrolidone are deprotected to form carboxylic acid groups, and wherein the polymerization product is functionalized with an amino acid, a peptide, a polypeptide, or a protein, including, but not limited to the tripeptide Arg-Gly-Asp (RGD).

In still another aspect, the present invention provides a chemically-amplified resist that can comprise the polymerization product of:
a pyrrolidone component comprising at least one pyrrolidone-containing monomer; and
an optional methacrylate component comprising at least one methacrylate-containing comonomer;
wherein the chemically-amplified resist is biocompatible, wherein the methacrylate component can comprise methyl methacrylate, t-butyl methacrylate, methacrylic acid, or any combination thereof. In this aspect, for example, the pyrrolidone component of this chemically-amplified resist can comprise 3-(t-butoxycarbonyl)-N-vinyl-2-pyrrolidone (TBNVP), and the methacrylate component of this chemically-amplified resist can comprise methyl methacrylate. Further in this aspect, for example, the pyrrolidone component of this chemically-amplified resist can comprise N-vinyl-2-pyrrolidone (NVP), and the methacrylate component of this chemically-amplified resist can comprise t-butyl methacrylate.

In another aspect of this invention, the chemically-amplified resist features a molar ratio of the pyrrolidone component to the methacrylate component that can range from about 1:100 to about 100:1. In this aspect, the molar ratio of the pyrrolidone component to the methacrylate component can also be from about 1:20 to about 20:1, and in a further aspect, from about 1:3 to about 3:1.

In another aspect, the chemically-amplified resist of this invention can further comprise the polymerization product of a photoacid generator component comprising at least one photoacid generator-containing comonomer. Thus, in this example, the chemically-amplified resist of this invention can comprise the polymerization product of:
a pyrrolidone component comprising at least one pyrrolidone-containing monomer;
an optional methacrylate component comprising at least one methacrylate-containing comonomer; and
a photoacid generator component comprising at least one photoacid generator-containing comonomer;
wherein the chemically-amplified resist is biocompatible. In this aspect, for example, the photoacid generator component can comprise [p-CH$_2$=C(CH$_3$)C(O)OC$_6$H$_4$SMe$_2$]OSO$_2$CF$_3$.

In another aspect, the chemically-amplified resist of this invention can comprise the polymerization product of:
a pyrrolidone component comprising at least one pyrrolidone-containing monomer;
an optional methacrylate component comprising at least one methacrylate-containing comonomer; and
an amino acid component comprising at least one compound of the formula

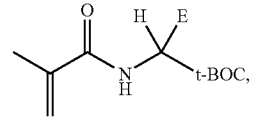

wherein E is selected from R$^1$, OR$^1$, SR$^1$, or NR$^1_2$; wherein R$^1$ is selected from a linear, branched, substituted, or unsubstituted hydrocarbyl having from 1 to about 30 carbon atoms; or hydrogen. In another aspect, any of the chemically-amplified resists of the present invention can further comprise the polymerization product of an amino acid component comprising at least one compound of the formula

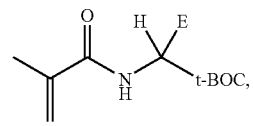

wherein E is selected from R$^1$, OR$^1$, SR$^1$, or NR$^1_2$; wherein R$^1$ is selected from a linear, branched, substituted, or unsubstituted hydrocarbyl having from 1 to about 30 carbon atoms; or hydrogen.

Additional aspects of this invention include, but are no limited to, the following. In one additional aspect, this invention provides a three-dimensional structure comprising a chemically-amplified resist, wherein the chemically-amplified resist can comprise the polymerization product of:
- a pyrrolidone component comprising at least one pyrrolidone-containing monomer; and
- an optional methacrylate component comprising at least one methacrylate-containing comonomer;
- wherein the chemically-amplified resist is biocompatible.

In another additional aspect, this invention provides a chemically-amplified resist that can comprise the polymerization product of:
- a pyrrolidone component comprising at least one pyrrolidone-containing monomer; and
- an optional methacrylate component comprising at least one methacrylate-containing comonomer;
- wherein the chemically-amplified resist is biocompatible, wherein the chemically-amplified resist can further comprise mammalian cells.

In yet another additional aspect, this invention provides a lithographic process comprising:
- exposing a lithographic recording medium to radiation to form a pattern; and
- developing the pattern;
- wherein the lithographic recording medium comprises the chemically-amplified resist, wherein the chemically-amplified resist can comprise the polymerization product of:
- a pyrrolidone component comprising at least one pyrrolidone-containing monomer; and
- an optional methacrylate component comprising at least one methacrylate-containing comonomer;
- wherein the chemically-amplified resist is biocompatible.

Bioresorbable Chemically-Amplified Bioresists

In one aspect, this invention provides a new approach toward the patterning of biomolecular layers using new biocompatible photoresist materials, which allow for the easy removal of the photoresist after applying the photolithographic pattern to the surface, in which the bioresists employed are bioresorbable.

In one aspect, this invention provides a series of functionalized poly(ε-caprolactone) copolymers, synthesized by the free radical ring opening copolymerization (ROP) of 2-methylene-1,3-dioxepane (MDO) with various vinyl monomers. In another aspect, for example, the vinyl monomers include, but are not limited to, $CH_2=CHR$, wherein R is selected from

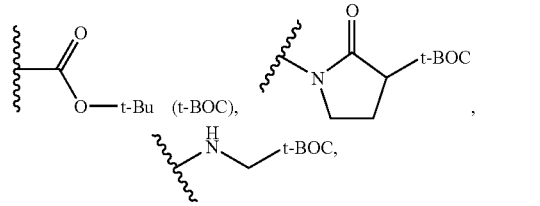

or any combination thereof. Because of the ring opening copolymerization (ROP) of 2-methylene-1,3-dioxepane (MDO), the copolymers formed had ester groups in the backbone as well as pendent functional groups. See, for example: Jin, S. and Gonsalves, K. E. *Macromolecules* 1998, 31, 1010-1015; which is incorporated herein by reference in its entirety. Thus these polymers contain bioresorbable or biodegradable segments.

In one aspect, this invention provides a chemically-amplified resist that can comprise the polymerization product of:
- a cyclic component comprising 2-methylene-1,3-dioxepane (MDO), a substituted analog thereof, or a combination thereof; and
- a vinyl component comprising at least one vinyl-containing comonomer of the formula $CH_2=CHR$, having from 3 to about 20 carbon atoms;
- wherein the chemically-amplified resist is bioresorbable.

In this aspect, for example, the vinyl component can comprise $CH_2=CHR$, wherein R is selected from

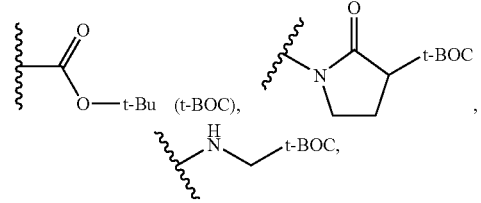

or any combination thereof. This chemically-amplified resist can further comprise the polymerization product of an amino acid component comprising at least one compound of the formula

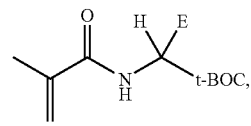

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen. Thus, in this aspect, this invention provides a chemically-amplified resist that can comprise the polymerization product of:
- a cyclic component comprising 2-methylene-1,3-dioxepane (MDO), a substituted analog thereof, or a combination thereof;
- a vinyl component comprising at least one vinyl-containing comonomer of the formula $CH_2=CHR$, having from 3 to about 20 carbon atoms; and
- a crosslinkable component, wherein the crosslinkable component comprises at least one compound having the formula:

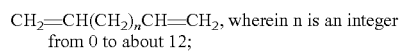

$CH_2=CH(CH_2)_nCH=CH_2$, wherein n is an integer from 0 to about 12;

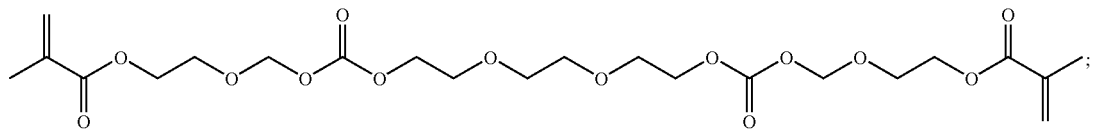

or any combination thereof;
wherein the chemically-amplified resist is bioresorbable. In this aspect, at least a portion of the crosslinkable component can be, but is not required to be, crosslinked.

Additional aspects of this invention include, but are no limited to, the following. In one additional aspect, this invention provides a three-dimensional structure comprising a chemically-amplified resist, wherein the chemically-amplified resist can comprise the polymerization product of:
- a cyclic component comprising 2-methylene-1,3-dioxepane (MDO), a substituted analog thereof, or a combination thereof; and
- a vinyl component comprising at least one vinyl-containing comonomer of the formula $CH_2=CHR$, having from 3 to about 20 carbon atoms;
wherein the chemically-amplified resist is bioresorbable.

In another additional aspect, this invention provides a chemically-amplified resist that can comprise the polymerization product of:
- a cyclic component comprising 2-methylene-1,3-dioxepane (MDO), a substituted analog thereof, or a combination thereof; and
- a vinyl component comprising at least one vinyl-containing comonomer of the formula $CH_2=CHR$, having from 3 to about 20 carbon atoms;
wherein the chemically-amplified resist is bioresorbable, and wherein the chemically-amplified resist can further comprise mammalian cells.

In yet another additional aspect, this invention provides a lithographic process comprising:
exposing a lithographic recording medium to radiation to form a pattern; and
developing the pattern;
wherein the lithographic recording medium comprises the chemically-amplified resist, wherein the chemically-amplified resist can comprise the polymerization product of:
- a cyclic component comprising 2-methylene-1,3-dioxepane (MDO), a substituted analog thereof, or a combination thereof; and
- a vinyl component comprising at least one vinyl-containing comonomer of the formula $CH_2=CHR$, having from 3 to about 20 carbon atoms;
wherein the chemically-amplified resist is bioresorbable.

The amino acid component of the formula $CH_2=CMeC(O)NHCHE$-t-BOC, wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen, is disclosed herein as a comonomer that can be copolymerized with a cyclic component comprising 2-methylene-1,3-dioxepane (MDO), a substituted analog thereof, or a combination thereof; and a vinyl component comprising at least one vinyl-containing comonomer of the formula $CH_2=CHR$, having from 3 to about 20 carbon atoms. In another aspect of this invention, the amino acid component can be homopolymerized to form a bioresist of this invention. In this aspect, the present invention provides a chemically-amplified resist comprising the polymerization product of:
an amino acid component comprising at least one compound of the formula

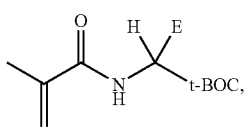

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen. These amino acid based materials were biocompatible as well as resorbable. In addition, the monomers indicated here were homopolymerized or copolymerized with MDO or TBNVP, or terpolymerized with MDO and TBNVP, to obtain optimum physical and mechanical properties.

Yet another aspect of this invention is a lithographic process comprising:
exposing a lithographic recording medium to radiation to form a pattern; and
developing the pattern;
wherein the lithographic recording medium comprises a chemically-amplified resist comprising the polymerization product of:
an amino acid component comprising at least one compound of the formula

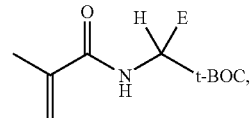

wherein E is selected from $R^1$, $OR^1$, $SR^1$, or $NR^1_2$; wherein $R^1$ is selected from a linear, branched, substituted, or unsubstituted hydrocarbyl having from 1 to about 30 carbon atoms; or hydrogen.

In another aspect, this invention provides a chemically-amplified resist comprising the product resulting from the ring-opening polymerization and hydrogenolysis of

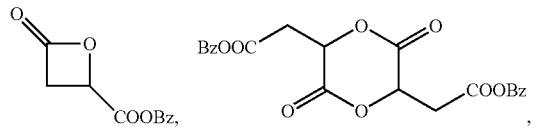

or any combination thereof; wherein Bz is benzyl $(CH_2C_6H_5)$. In this aspect, this invention also provides a three-dimensional structure comprising this chemically-amplified resist. Also in this aspect, this invention provides this chemically-amplified resist further comprising mammalian cells. Further, this invention provides a lithographic process comprising:
exposing a lithographic recording medium to radiation to form a pattern; and
developing the pattern;
wherein the lithographic recording medium comprises a chemically-amplified resist comprising the product resulting from the ring-opening polymerization and hydrogenolysis of

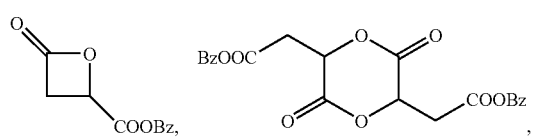

or any combination thereof; wherein Bz is benzyl $(CH_2C_6H_5)$.

In yet another aspect, this invention provides a chemically-amplified resist comprising a polymer, wherein the polymer comprises moieties selected from:

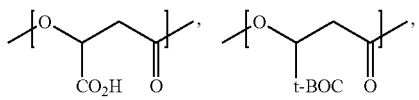

or any combination thereof. In this aspect, this invention also provides a three-dimensional structure comprising this chemically-amplified resist. Also in this aspect, this invention provides this chemically-amplified resist further comprising mammalian cells. Further, this invention provides a lithographic process comprising:

exposing a lithographic recording medium to radiation to form a pattern; and
developing the pattern;
wherein the lithographic recording medium comprises a chemically-amplified resist comprising a polymer, wherein the polymer comprises moieties selected from:

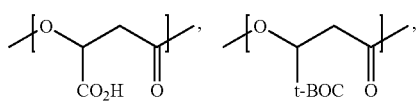

or any combination thereof.

In still another aspect, the present invention provides a chemically-amplified resist comprising a polymer, wherein the polymer comprises moieties selected from:

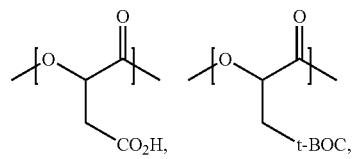

or any combination thereof. In this aspect, this invention also provides a three-dimensional structure comprising this chemically-amplified resist. Also in this aspect, this invention provides this chemically-amplified resist further comprising mammalian cells. Further, this invention provides a lithographic process comprising:

exposing a lithographic recording medium to radiation to form a pattern; and
developing the pattern;
wherein the lithographic recording medium comprises a chemically-amplified resist comprising a polymer, wherein the polymer comprises moieties selected from:

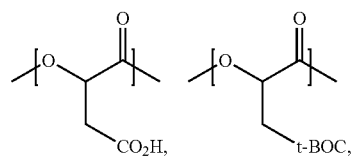

or any combination thereof.

Three-Dimensional Bioresist Structures and Methods of Making the Same

In one aspect, a variety of 3-dimensional (3-D) structures were prepared by methods provided in this invention.

Method 1. In one aspect, the construction of a microporous foam was used to form a 3-D structure that creates a suitable biomimetic environment for cell infiltration and growth in vivo. Such structures are also expected to lead to vascular and connective tissue infiltration and growth in vivo. For example, crosslinked 3-dimensional (3-D) type structures such as 10 were prepared by copolymerizing 2-methylene-1,3-dioxepane (MDO) (6) with 7, 8, or a combination of 7 and 8, along with a diolefinic crosslinker molecule of the general form 9, as illustrated in Scheme 3.

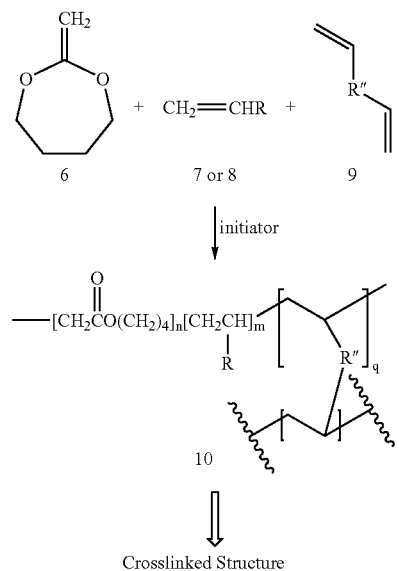

Figure 6:
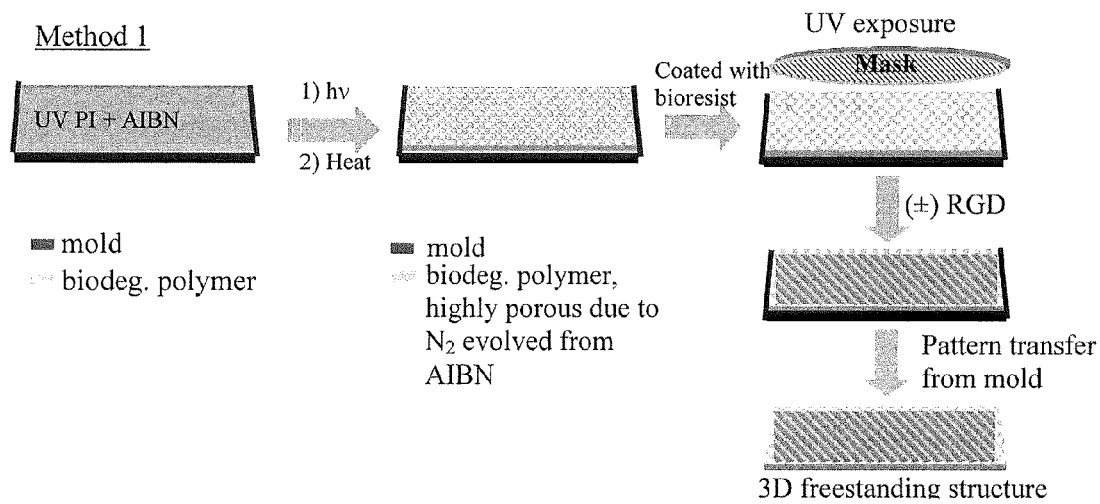
FIG. 6 shows a method of forming a 3-dimensional structure.

During the crosslinking reaction, subsequent to initiation by a low temperature process such as photopolymerization, additional azobisisobutyronitrile (AIBN) was added, or alternatively, $CO_2$ was bubbled into the reactor. The system was then heated so that the $N_2$ gas evolved by the decomposition of the AIBN initiator acts as a blowing agent to form a cellular, three dimensional foam structure, as illustrated in FIG. 6. Because these structures contain t-BOC groups, they permit patterning of the "top" surfaces of the foam.

Figure 7:
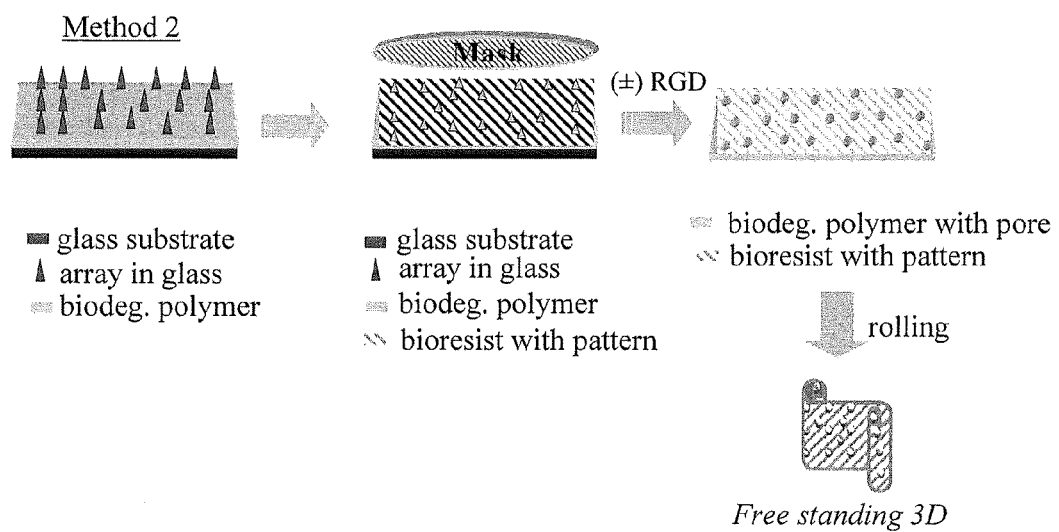
FIG. 7 shows a method of forming a 3-dimensional structure.

Method 2. In another aspect, a three-dimensional bioresist material was prepared as follows. First, a glass substrate with pillared arrays was fabricated through etching techniques, such as those disclosed in Moreau, W. M. *Semiconductor Lithography: Principles, Practices, and Materials*, Plenum, New York, 1987; which is incorporated herein by reference in its entirety. This glass substrate comprising pillared arrays was used as a temporary substrate. A biodegradable and biocompatible polymer was then coated onto the glass substrate, and cured using either a thermal or a UV polymerization technique as required. A second coating of a bioresist polymer was spin-cast onto the first cured polymeric surface on the top of the glass substrate, exposed to UV lamp, and then post-exposure baked (PEB) to reveal the images on the top. The fabricated device was then peeled off the glass substrate to provide a free-standing 3-D structure with controlled pore sizes, as illustrated in FIG. 7, based on the dimensions of the UV mask. Bioresists prepared in this manner, in which substrates were directly patterned by lithography, can then be used for cell alignment and fabrication of 3-D tissue scaffolds.

Method 3. In still another aspect, several three-dimensional bioresist materials with patterned layers were prepared according to Method 2, seeded with cells and then laid on top of each other sequentially so that a biomimetic-type structure was obtained. The layers were then soldered using one of the photochemically-active polymers synthesized above. Alternatively, thermal annealing is another method by which to solder the layers. In either instance, chemical crosslinking combined with thermoplastic reflow of the polymers will generate chain entanglement.

Figure 8:
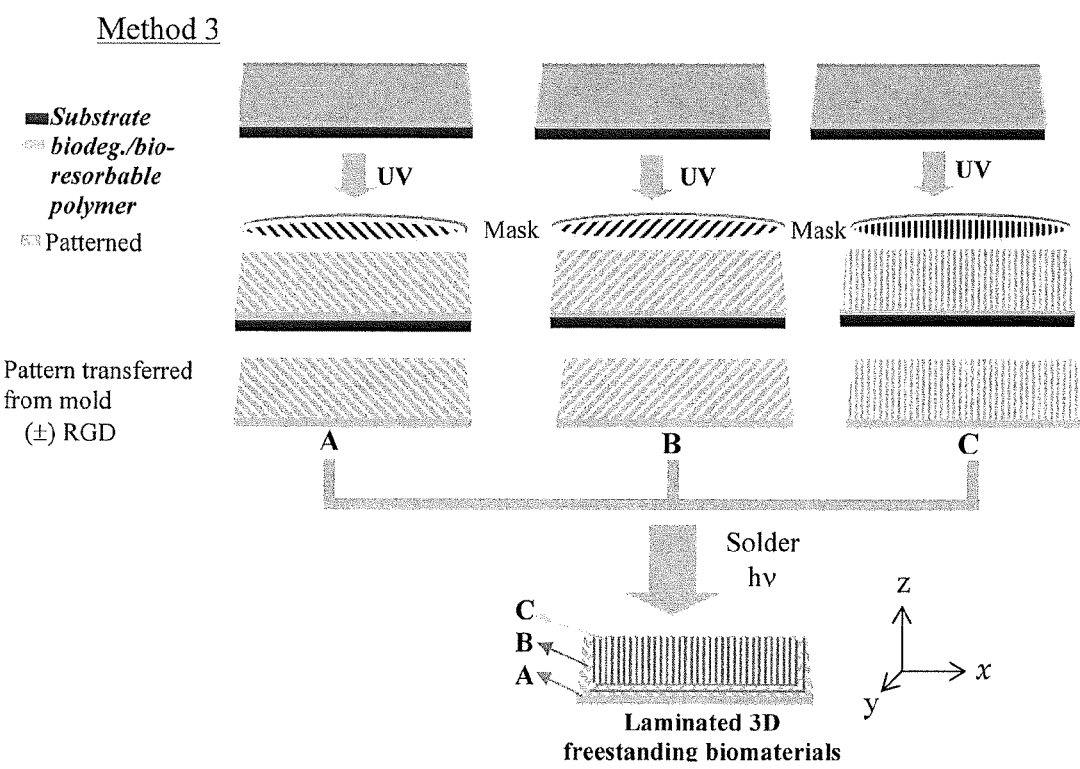
FIG. 8 shows a method of forming a 3-dimensional structure.

The soldering was restricted to the outer edges of the scaffold, using a fiber optic cable with a UV laser source to afford the free-standing 3-D biomaterial, as illustrated in FIG. 8.

Thus, in one aspect, the present invention provides a chemically-amplified resist that comprises the polymerization product of:
a cyclic component comprising 2-methylene-1,3-dioxepane (MDO), a substituted analog thereof, or a combination thereof;
a vinyl component comprising at least one vinyl-containing comonomer of the formula $CH_2=CHR$, having from 3 to about 20 carbon atoms; and
a crosslinkable component, wherein the crosslinkable component comprises at least one compound having the formula:

$CH_2=CH(CH_2)_nCH=CH_2$, wherein n is an integer from 0 to about 12;

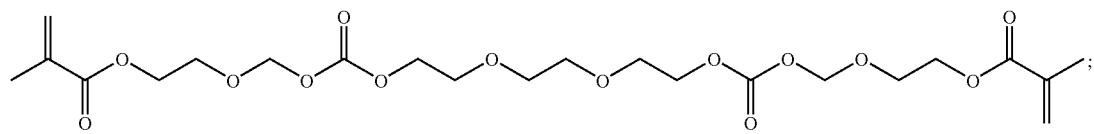

or any combination thereof;
wherein the chemically-amplified resist is bioresorbable. In this aspect, at least a portion of the crosslinkable component can be, but is not required to be, crosslinked. In a further aspect, a method of making a 3-dimensional bioresist is provided, wherein the method comprises:
a) copolymerizing:
1) a cyclic component comprising 2-methylene-1,3-dioxepane (MDO), a substituted analog thereof, or a combination thereof;
2) a crosslinkable component, wherein the crosslinkable component comprising at least one compound having the formula:

$CH_2=CH(CH_2)_nCH=CH_2$, wherein n is an integer from 0 to about 12;

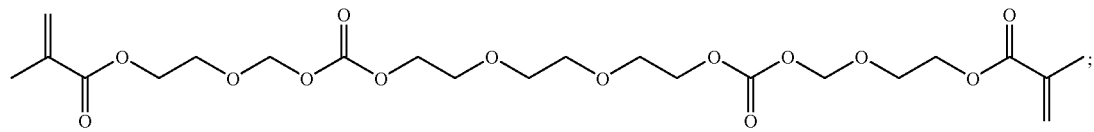

or any combination thereof;
3) an optional vinyl component comprising at least one vinyl-containing comonomer of the formula $CH_2=CHR$, having from 3 to about 20 carbon atoms; and
4) an optional amino acid component comprising at least one compound of the formula

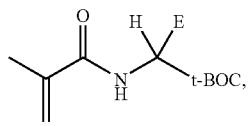

wherein E is selected from $R^1$, $OR^1$, $SR^1$, or $NR^1_2$;
wherein $R^1$ is selected from a linear, branched, substituted, or unsubstituted hydrocarbyl having from 1 to about 30 carbon atoms; or hydrogen;
in solution to form a biocompatible chemically-amplified resist;
b) providing a gas to the solution; and
c) crosslinking the crosslinkable component of the chemically-amplified resist. In this aspect, typically an inert gas is supplied to the solution, such as dinitrogen or argon.

Other methods for making a 3-dimensional bioresist are also provided by this invention. In one aspect, this invention provides a method of making a 3-dimensional bioresist is provided, wherein the method comprises:
a) providing a substrate comprising pillared arrays;
b) forming a first coating on the substrate, wherein the first coating comprises a biodegradable polymer;
c) curing the first coating;
d) forming a second coating on the first coating, wherein the second coating comprises a biocompatible resist;
e) exposing the second coating to radiation to form a pattern;
f) developing the pattern; and
g) optionally removing the combined first coating and second coating from the substrate to form a 3-dimensional bioresist. In an additional aspect of this method, this 3-dimensional bioresist can be subjected to simple processes such as rolling, folding, bending, twisting, crinkling, doubling, or creasing, to allow for shaping the 3-dimensional bioresist in any method desired. Also in this aspect, this invention provides for a method for making a 3-dimensional bioresist comprising steps a through g recited above, and further comprises:
repeating steps a through g to form at least one additional 3-dimensional bioresist; and
stacking the additional 3-dimensional bioresists onto the first 3-dimensional bioresist. In another aspect, these stacked 3-dimensional bioresists can also be subjected to rolling, folding, bending, twisting, crinkling, doubling, or creasing the stacked, to shape the 3-dimensional bioresist to any desired shape.

Bioelectroactive Resists

The development of interactive biomaterials, including the use of cells supported on scaffolding for subsequent implantation, represents an emerging field of tissue engineering, and may prove important to the next generation of implantable devices and prosthetics. In one aspect, it is desirable to provide biomaterials that provide for spatial organization of mammalian cells for applications such as cell based sensors and diagnostic tests, interfacing regenerating neurons with solid state devices in vivo, construction of neural networks in vitro, medical and dental implants, co-cultures of different cell types in vitro, microfabrication of devices in vitro, and the like. In the case of nerve cell fibers, the extending axon projection should be directed specifically to the area of intended innervation. (See, for example: Rajnicek 1997, Miller, 2001)

Steady polarized, extracellular, DC voltage gradients are a normal environmental component in the developing nervous system and have been shown to stimulate the healing of spinal and peripheral nerves. Therefore, it would be useful to design and fabricate micropatterned and nanopatterned biomaterials that can provide topographical cues for alignment and guidance of nerve cells, as well as comprise a conducting or electroactive component to possibly aid in the development, generation and regeneration of nerve cells.

Thus, in one aspect, the present invention provides for polypyrrole-type components that are also biocompatible and could be biodegradable. By using biodegradable, electroactive or electrically-conductive biomaterials, it is believed the microfabricated structures prepared using such materials will permit nerve development, regeneration, biocompatibility, proliferation, and guidance. The primary cell lines used to grow in the biomaterials of this aspect of the present invention are Sympathetic (Symp) and Dorsal Root Ganglion (DRG) neurons. These biomaterials will also pertinent to mention here that the imagable bioelectroactive polymers will be applicable for bioMEMS type devices and DNA sensors See: Garnier, F., Korri-Youssoufi, H., Srivastava, P., Mandrand, B., and Delair, T Synth. Met. 100, p. 89, (1999); which is incorporated herein by reference in its entirety.

In one aspect, this invention provides a resist comprising the polymerization product of:
a pyrrole component comprising at least one pyrrole-containing monomer, each of which is optionally functionalized with at least one t-butoxycarbonyl group; and
an amidopyrrole component comprising at least one amidopyrrole-containing comonomer;
wherein the resist is biocompatible. In another aspect, the amidopyrrole-containing comonomer of this polymerization product can be further functionalized with an amino acid, a peptide, a polypeptide, or a protein. For example, the amidopyrrole-containing comonomer can be further functionalized with polypeptide sequences including, but not limited to, IKVAV (SEQ ID NO: 1), YIGSR (SEQ ID NO: 2), or a combination thereof. In still another aspect, the polymerization product can functionalized with an amino acid, a peptide, a polypeptide, or a protein.

In another aspect, the present invention provides a resist comprising the polymerization product of:
a pyrrole component comprising at least one pyrrole-containing monomer, each of which is optionally functionalized with at least one t-butoxycarbonyl group; and
an amidopyrrole component comprising at least one amidopyrrole-containing comonomer;
wherein the resist is biocompatible, and wherein the resist comprises the following structure.

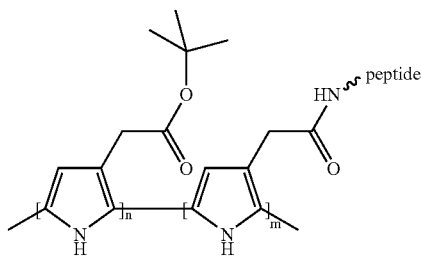

11

In yet another aspect of this invention, the present invention provides a resist comprising the polymerization product of a pyrrole component comprising at least one pyrrole-containing monomer, each of which is optionally functionalized with at least one t-butoxycarbonyl group; and an amidopyrrole component comprising at least one amidopyrrole-containing comonomer, wherein some or all of the t-butoxycarbonyl groups of the polymerization product are deprotected to form carboxylic acid groups.

In another aspect, this invention also provides a three-dimensional structure comprising a resist, wherein the resist comprising the polymerization product of:
a pyrrole component comprising at least one pyrrole-containing monomer, each of which is optionally functionalized with at least one t-butoxycarbonyl group; and
an amidopyrrole component comprising at least one amidopyrrole-containing comonomer;
wherein the resist is biocompatible. Also in this aspect, this invention provides this biocompatible resist further comprising mammalian cells. Further, this invention provides a lithographic process comprising:
exposing a lithographic recording medium to radiation to form a pattern; and
developing the pattern;
wherein the lithographic recording medium comprises a resist comprising the polymerization product of:
a pyrrole component comprising at least one pyrrole-containing monomer, each of which is optionally functionalized with at least one t-butoxycarbonyl group; and
an amidopyrrole component comprising at least one amidopyrrole-containing comonomer;
wherein the resist is biocompatible.

In still another aspect, this invention provides a resist comprising:
at least one pyrrole component, each comprising the polymerization product of at least one pyrrole-containing monomer, wherein each pyrrole-containing monomer is optionally functionalized with at least one t-butoxycarbonyl group; and
at least one chemical spacer separating the pyrrole components comprising from about 3 to about 30 carbon atoms. In this aspect, for example, the chemical spacer can comprise a moiety L, wherein:
L is selected from $(CH_2)_n$, $(CH_2)_nOC(O)(CH_2)_m$, $(CH_2)_nOC(O)(CH_2)_mC(O)O(CH_2)_n$, $CHRNHC(O)(CH_2)_nC(O)NHCHR$, $(CH_2)_nNHC(O)(CH_2)_m$, or any combination thereof;
n is independently selected from an integer from 1 to about 12;
m is independently selected from an integer from 1 to about 12;
R is independently selected from H, hydrocarbyl having from 1 to about 12 carbon atoms, or an amino acid residue. Further in this aspect, for example, the chemical spacer can have the formula NHC(O)LC(O)NH.

In another aspect, the spacer can comprise $L_p$ wherein L is defined as immediately above, and p is selected from an integer from about 1 to about 6.

In yet another aspect, this invention provides a resist comprising the polymerization product of:
at least one pyrrole component, each comprising the polymerization product of at least one pyrrole-containing monomer, wherein each pyrrole-containing monomer is optionally functionalized with at least one t-butoxycarbonyl group; and
at least one chemical spacer separating the pyrrole components comprising from about 3 to about 30 carbon atoms;
wherein some or all of the t-butoxycarbonyl groups of the polymerization product are deprotected to form carboxylic acid groups. In another aspect, for example, the resist can comprise a structure having the following formula:

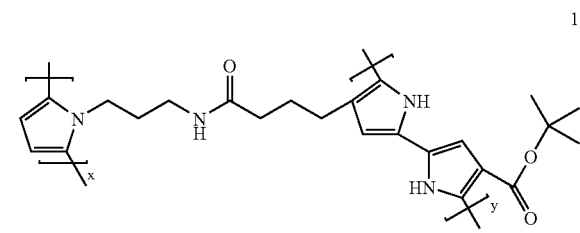

12

In another aspect, this invention also provides a three-dimensional structure comprising a resist, wherein the resist comprising the polymerization product of:

at least one pyrrole component, each comprising the polymerization product of at least one pyrrole-containing monomer, wherein each pyrrole-containing monomer is optionally functionalized with at least one t-butoxycarbonyl group; and at least one chemical spacer separating the pyrrole components comprising from about 3 to about 30 carbon atoms.

Also in this aspect, this invention provides this biocompatible resist further comprising mammalian cells. Further, this invention provides a lithographic process comprising:

exposing a lithographic recording medium to radiation to form a pattern; and developing the pattern;

wherein the lithographic recording medium comprises a resist comprising the polymerization product of:

wherein the resist comprising the polymerization product of:

at least one pyrrole component, each comprising the polymerization product of at least one pyrrole-containing monomer, wherein each pyrrole-containing monomer is optionally functionalized with at least one t-butoxycarbonyl group; and at least one chemical spacer separating the pyrrole components comprising from about 3 to about 30 carbon atoms.

In yet another aspect, this invention provides a resist comprising the polymerization product of:

a thiophene component comprising at least one thiophene-containing oligomer, wherein the oligomer comprises a polymerizable moiety;

a cyclic component comprising 2-methylene-1,3-dioxepane (MDO), a substituted analog thereof, or a combination thereof; and a vinyl component comprising at least one vinyl-containing comonomer of the formula $CH_2$=CHR, having from 3 to about 20 carbon atoms;

wherein the resist is biocompatible. In this aspect, for example, the thiophene component can comprise a compound of the following formula, wherein n is an integer from 1 to about 9.

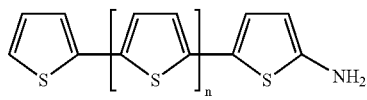

Further in this aspect, the vinyl component of this resist can comprise $CH_2$=CHR, wherein R is selected from

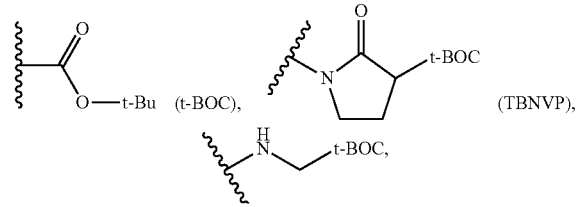

N-vinyl-2-pyrrolidone (NVP), t-butyl methacrylate, methyl methacrylate, methacrylic acid, or any combination thereof. Also in this aspect, this invention provides a resist comprising a polymerization product having the following formula:

In another aspect, this invention also provides a three-dimensional structure comprising a resist, wherein the resist comprising the polymerization product of:

a thiophene component comprising at least one thiophene-containing oligomer, wherein the oligomer comprises a polymerizable moiety;

a cyclic component comprising 2-methylene-1,3-dioxepane (MDO), a substituted analog thereof, or a combination thereof; and a vinyl component comprising at least one vinyl-containing comonomer of the formula $CH_2$=CHR, having from 3 to about 20 carbon atoms;

wherein the resist is biocompatible. Also in this aspect, this invention provides this biocompatible resist further comprising mammalian cells. Further, this invention provides a lithographic process comprising:

exposing a lithographic recording medium to radiation to form a pattern; and developing the pattern;

wherein the lithographic recording medium comprises a resist comprising the polymerization product of:

a thiophene component comprising at least one thiophene-containing oligomer, wherein the oligomer comprises a polymerizable moiety;

a cyclic component comprising 2-methylene-1,3-dioxepane (MDO), a substituted analog thereof, or a combination thereof; and a vinyl component comprising at least one vinyl-containing comonomer of the formula $CH_2$=CHR, having from 3 to about 20 carbon atoms;

wherein the resist is biocompatible.

Lithography and Scalability

One aspect of the bioresists disclosed herein in the scalability of the lithographic process. In this aspect, for example, lithographic features can be obtained on 4- and 6-inch substrates. Furthermore, using projection lithographic systems, including, but not limited to 365, 248, and 193 nm steppers, imaging can be achieved on multiple substrates. In a typical semiconductor fabrication line, processing 60 to 80, 8-inch wafers per hour containing highly complex patterns is usually considered standard. Hence the simpler patterns disclosed herein for biodegradable substrates are relatively straightforward and scalable from 2-dimensional to 3-dimensional structures.

In one aspect, a typical fabrication of patterned two-dimensional (2-D) structures was carried out as follows. Thus, the t-BOC containing bioresist materials synthesized in the Examples and Schemes disclosed herein were tested for their lithographic performance using various projection lithographic process (365 nm, DUV, 193 nm, and the like), according to the following general procedure.

1. Bioresist solutions were prepared in propylene glycol methyl ether (PGME) and a photoacid generator (PAG) was added.

2. The resulting solution was filtered and a resist film was obtained by spinning the solution on a clean glass slide.

3. The film was then baked on a hot plate (for example, 120° C. for 1 min) to remove the solvent (PAB).

13

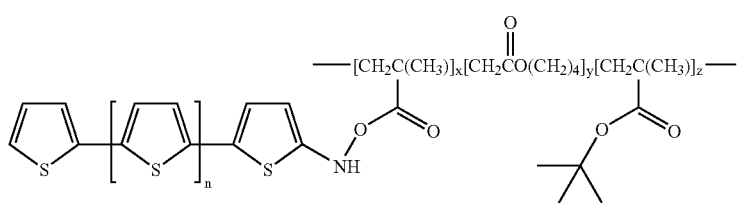

4. The resulting film was exposed to the UV source through a mask and then post exposure baked (PEB) (for example, at 120° C. for 1 min).

In another aspect, this method typically does not require a subsequent post-development step using strong bases to obtain the desired features on the bioresists, thereby rendering this process highly desirable for direct cell and protein patterning. Alternative PAGs such as 2-nitrobenzylester of sulfonic acid and its derivatives were also used. See, for example: Ahn, K. D., Koo, J. S. and Chung, C. M. *J Polym Sci Polym Chem Ed* 1996, 34, 183; Thackeray, J. W., Adams, T., Cronin, M. F., Denison, M., Fedynyshyn, T. H., Georger, J., Mori, J. M., Orsula, G. W. and Sinta, R. *J Photopolym Sci Technol* 1994, 7, 619-630; Ito, H., Breyta, G., Hofer, D., Fisher, R. and Prime, B. *Proc SPIE* 1995, 2438, 53-60; Ito, H., Breyta, G., Sooriyakumaren, R. and Hofer, D. *J Photopolym Sci Technol* 1995, 8, 505-518; each of which is incorporated herein by reference in its entirety.

By this method, there is typically no subsequent post development required using strong bases to obtain the desired features on the bioresists. This is extremely desirable for direct cell and protein patterning. Alternative PAGs such as 2-nitrobenzylester of sulfonic acid (Ahn et al, 1996; Thackeray et al, 1994; Ito et al, 1995) and its derivatives were also used.

DEFINITIONS

In order to more clearly define the terms used herein, the following definitions are provided. To the extent that any definition or usage provided by any document incorporated herein by reference conflicts with the definition or usage provided herein, the definition or usage provided herein controls.

A resist, as used herein, refers to the imaging or recording medium, typically a radiation-sensitive polymeric material, that is used in a lithographic process for the production of patterned surfaces. In a typical process, for example, the resist polymer is deposited on a substrate and the resist-coated substrate is exposed to a suitable radiation source through a patterned mask, such that the mask pattern is "replicated" on the resist polymer. Irradiation alters the physical or chemical properties of the exposed regions of the resist, which typically modifies the solubility of the exposed area such that the exposed and unexposed areas on the resist film are differentiated in a subsequent development step, resulting in positive or negative images. See, for example: Gonsalves, K. E., Merhari, L., Wu, H. and Hu, Y. *Adv Mater* 2001, 13, 703-714, which is incorporated herein by reference in its entirety. Thus, in a general sense, a resist is a material that is used to prevent or resist a particular chemical or physical reaction such as chemical attack, electrodeposition, vapor phase deposition, or other reactions.

Figure 4:
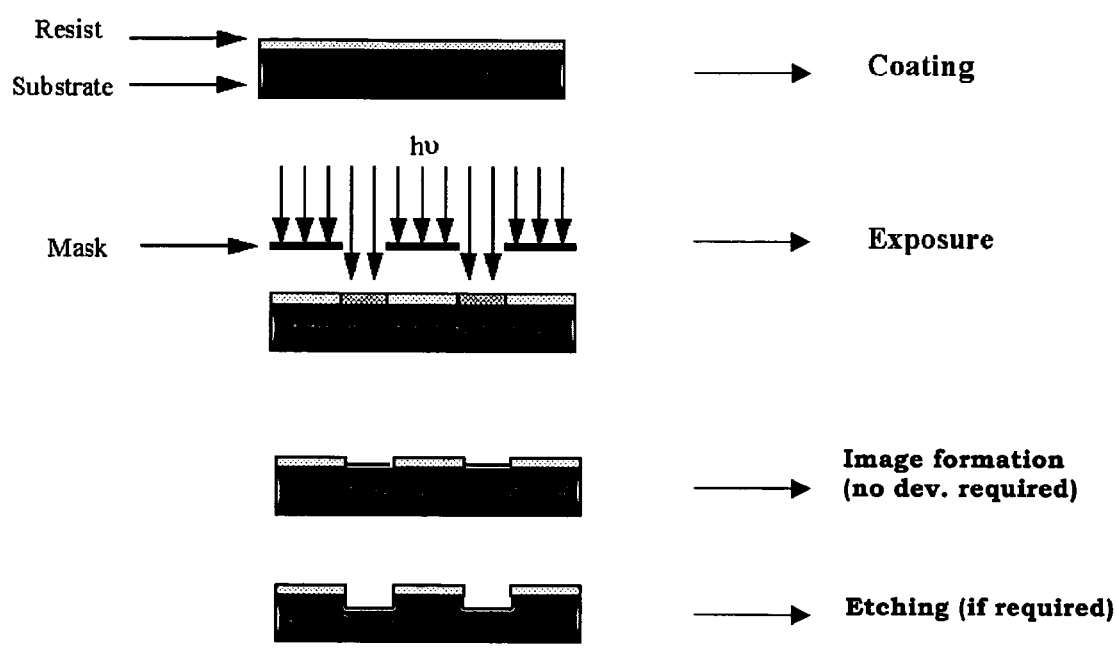
FIG. 4 illustrates one aspect of this invention and provides a schematic representing a typical lithographic process.

Lithography, or a lithographic process, as used herein, refers to a process by which the pattern is replicated or imprinted onto a recording medium, also termed a resist. Lithography may be accomplished by exposing a recording medium with radiation of some form, followed by developing the pattern to be used, which results in the removal of either the exposed or the unexposed material. A variety of radiation sources may be used, including but not limited to, 248 nm radiation, 193 nm radiation, 157 nm radiation, ultraviolet (UV) radiation, vacuum ultraviolet (VUV), 13.5 nm extreme ultraviolet (EUV), deep ultraviolet (DUV) radiation, X-rays, electron beams (EB), and ion beams (IB). See: Bowden, M. J. and Turner, S. R. Electronic and Photonic Applications of Polymers, ACS Series 218, 1988. A typical lithographic process is shown in FIG. 4.

The term amino acid component as used herein to describe a component of a polymer, is used to include the protected amino acid, such as a t-BOC-protected amino acid, as well as the unprotected amino acid.

The compound N-vinyl-2-pyrrolidinone [CAS No. 88-12-0] is also known as 1-vinyl-2-pyrrolidinone; 1-vinyl-2-pyrrolidone; 1-vinylpyrrolidinone; 2-pyrrolidinone, 1-ethenyl-; N-vinyl-2-pyrrolidinone; N-vinyl-2-pyrrolidinone, stabilized with 0.1% flake caustic soda; N-vinyl-2-pyrrolidone; N-vinyl pyrrolidinone; N-vinylpyrrolidone; vinylbutyrolactam; vinylpyrrolidinone.

The terms pyrrolidone or pyrrolidinone are typically used herein to refer to 2-pyrrolidone (also termed pyrrolid-2-one), wherein the pyrrolidone NH and CO moieties are adjacent to each other in the 5-membered ring.

For any particular compound disclosed herein, any general structure presented also encompasses all conformational isomers, regioisomers, and stereoisomers that may arise from a particular set of substituents. The general structure also encompasses all enantiomers, diastereomers, and other optical isomers whether in enantiomeric or racemic forms, as well as mixtures of stereoisomers, as the context requires.

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims.

EXAMPLES

Abbreviations used in the following examples, and throughout this disclosure, include at least the following:
AIBN, N,N'-Azobisisobutyronitrile; TPSTf, Triphenylsulfonium triflate;
tBMA or TBMA, t-butyl methacrylate;
CAR, chemically-amplified resist;
DCC, N,N'-dicyclohexylcarbodiimide;
DMTA, dynamic mechanical thermal analysis;
DSC, differential scanning calorimetry;
D-TBNVP, deprotected TBNVP, 3-(carboxylic acid)-N-vinyl-2-pyrrolidone;
ECM, extracellular matrix;
EDC, N-(3-dimethylaminopropyl)-N'-ethylcarbodiimide hydrochloride;
FTIR, Fourier transform infrared spectroscopy;
GPC, gel permeation chromatography;
IKAV, polypeptide sequence Ile-Lys-Val-Ala-Val (SEQ ID NO: 1);
MDO, 2-methylene-1,3-dioxepane;
MMA, methyl methacrylate;
MAA, methacrylic acid
MWD, molecular weight distribution, or polydispersity;
NA, numerical aperture;
NHS, N-hydroxy succinimide;
NMR, nuclear magnetic resonance;
NVP, N-Vinyl-2-pyrrolidone or N-vinyl-2-pyrrolidinone;
PAG, photoacid generator;
PBS, phosphate buffered saline;
PEB, post exposure bake;
RGD, tripeptide sequence Arg-Gly-Asp;
PGME, propylene glycol methyl ether;
PMTM, polymethylthienyl methacrylate
ROP, ring-opening polymerization;
TBMA or tBMA, t-butyl methacrylate;
TBNVP, 3-(t-butoxycarbonyl)-N-vinyl-2-pyrrolidone;
TGA, thermogravimetric analysis;
TMAH, tetramethylammonium hydroxide;
TPSTf, triphenylsulfonium triflate;
YIGSR, polypeptide sequence Tyr-Ile-Gly-Ser-Arg (SEQ ID NO: 2).

Example 1

General Details, Starting Materials, and Characterization Methods

Materials. N-Vinyl-2-pyrrolidone (NVP), t-butyl methacrylate (tBMA), and methyl methacrylate (MMA) were purchased from Aldrich Chemical Company (Milwaukee, Wis.) and distilled prior to use. N,N'-Azobisisobutyronitrile (AIBN) was obtained from Aldrich and purified by recrystallization from methanol. Triphenylsulfonium triflate (TPSTf) (used as a photoacid generator (PAG)) was purchased from Aldrich Chemical Company and used as received. Other photoacid generating groups (PAG) that could be used in this invention include, but are not limited to, triphenylsulfonium hexafluoroantimonate, triphenylsulfonium triflate, or a combination thereof.

Polymer Characterization. The synthetic polymers disclosed herein were characterized by gel permeation chromatography (GPC) (for molecular weight measurements); $^1$H and $^{13}$C nuclear magnetic resonance (NMR) and Fourier transform infrared spectroscopy (FTIR) (for chemical structure analysis); and differential scanning calorimetry (DSC) and thermogravimetric analysis (TGA) (for thermal property analysis). In addition, for crosslinked systems dynamic mechanical thermal analysis (DMTA) were applied.

Lithography. To obtain feature sizes in the range from about 1 μm to about 50 μm, a 365 nm stepper (HTG Contact Mask Printer, Hybrid Technology Group, San Jose, Calif.) was used as the UV source. For obtaining feature sizes from about 1 μm to about 0.1 μm scale, the wavelength of the stepper was reduced. Resolution can be improved by reducing wavelength λ, by reducing numerical factor k, an instrument constant, and by increasing numerical aperture (NA). See: Wallraff, G. M. and Hinsberg, W. D. *Chem Rev* 1999, 99, 1801-1821; which is incorporated herein by reference, in its entirety. For achieving high resolution in the submicron scale, an ASML stepper 5500/9XX operating at 193 nm with 0.63 NA was utilized.

The masks used in the lithographic patterning were custom designed and fabricated by the Photo Sciences Inc., Torrance, Calif. Various features were presented on the mask in order to examine a range of patterns, such as simple lines and spaces with line widths in the range from about 10 to about 50 μm and a space of about 50 μm, as well as cross-hatched patterns and the like. The spacing feature was useful to optimize the initial orientation of cells leading to extracellular matrix (ECM) formation, as illustrated in the Examples and Figures herein.

Example 2

Preparation of the olefinic monomer 3-(t-butoxycarbonyl)-N-vinyl-2-pyrrolidone (TBNVP)

The monomer 3-(t-butoxycarbonyl)-N-vinyl-2-pyrrolidone (TBNVP) 1 was prepared according to the literature procedures, with modifications as disclosed herein. (See: He, W.; Gonsalves, K. E.; Pickett, J. H.; Halberstadt, C. *Biomacromolecules* 2003, 4, 75-79; U.S. Pat. No. 5,750,680, each of which is incorporated herein by reference in its entirety.) Scheme 1 illustrates the preparation of TBNVP according to the present invention.

A suspension of lithium diisopropylamide was prepared by reacting diisopropylamine (10.12 g, 100 mmol) in anhydrous THF (40 mL) and n-butyllithium (40 mL, 100 mmol, 2.5 M solution in hexane), then cooled to −78° C. A sample of N-Vinyl-2-pyrrolidone (NVP; 11.12 g, 100 mmol) was added dropwise to the suspension of lithium diisopropylamide at −78° C., then the resulting mixture was stirred at −78° C. for 2 h. After this time, di-t-butyl dicarbonate (24 g, 100 mmol) was added dropwise to the stirred mixture, after which, the resulting solution was again stirred at −78° C. for 2 h. This solution was allowed to warm to room temperature, then a saturated, aqueous NH$_4$Cl solution was added to quench the reaction. The organic layer was separated and washed with de-ionized water, and the aqueous layer was extracted with diethyl ether. The ether extract was combined with the organic layer, and the combined organic solution was dried over anhydrous MgSO$_4$ and concentrated under vacuum with a rotary evaporator. Purification was carried out by column chromatography (silica gel; hexanes/ethyl acetate=4/1 v:v).

Example 3

Homopolymerization of 3-(t-butoxycarbonyl)-N-vinyl-2-pyrrolidone (TBNVP) to form poly-(TBNVP)

The monomer 3-(t-butoxycarbonyl)-N-vinyl-2-pyrrolidone (TBNVP) 1 could be homopolymerized to form the chemically-amplified resist (CAR), bioresist, 2 (Scheme 2) by any number of free radical polymerization methods, including atom transfer radical polymerization (ATRP) techniques. See: Yuan, J. Y. and Pan, C. Y. *European Polymer J* 2002, 38, 1565-1571; Yuan, J. Y. and Pan, C. Y. *European Polymer J* 2002, 38, 2069-2076; each of which is incorporated herein by reference in its entirety. A typical homopolymerization reaction is disclosed herein.

A solution of 2.0 g of TBNVP in 10 mL of THF (monomer concentration 1.0 mol·L$^{-1}$) containing 0.0246 g of AIBN ($1.5 \times 10^{-2}$ mol·L$^{-1}$) was placed in a Schlenk tube under an N$_2$ atmosphere. The mixture was degassed by at least 2-3 freeze-pump-thaw cycles, and then placed in a preheated oil bath maintained at 65-75° C. for 24 h. After this time, the polymer was precipitated with petroleum ether, redissolved in THF, and subsequently reprecipitated to minimize the amount of residual unreacted monomer. The polymer obtained in this fashion was dried in vacuo at 40° C. to a constant weight.

Example 4

Copolymerization of 3-(t-butoxycarbonyl)-N-vinyl-2-pyrrolidone (TBNVP) with methyl methacrylate (MMA) to form poly-(MMA-TBNVP)

The monomer 3-(t-butoxycarbonyl)-N-vinyl-2-pyrrolidone (TBNVP) 1 was copolymerized with methyl methacrylate (MMA) to form the chemically-amplified resist (CAR) 5, comprising a MMA-TBNVP copolymer ("poly-(MMA-TBNVP)"), having the structure shown below, as follows.

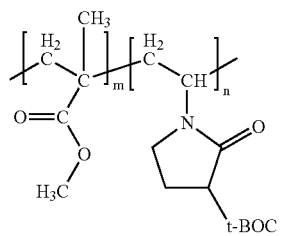

The MMA-TBNVP copolymer was prepared by AIBN-initiated free radical polymerization. See: W. He et al., 2003; "Lithography Application of a Novel Photoresist for Patterning of Cells" Biomaterials 25, 2055 (2004); W. He, C. Halberstadt and K. E. Gonsalves, which are incorporated herein by reference in their entirety. A mixture of 2.1 g of TBNVP and 0.7 g of MMA was dissolved in 16 mL of THF (monomer concentration 1.0 mol·L⁻¹), along with 0.0398 g of AIBN (1.5×10⁻² mol·L⁻¹) and this mixture was heated to 65-75° C. under a nitrogen atmosphere for 24 h. To isolate the polymer, the reaction mixture was added dropwise into a sufficient volume of petroleum ether to precipitate the resulting polymer. The polymer product was filtered off and washed thoroughly with petroleum ether. The isolated product was then redissolved in THF and subsequently reprecipitated to minimize the amount of residual unreacted monomer. The polymer obtained in this fashion was dried in vacuo at 40° C. to a constant weight.

Example 5

Chemical Modification of Material Surfaces with Immobilized, Bioactive Peptides The tripeptide sequence Arg-Gly-Asp (RGD) was tethered to the bioresist material surface through in situ activation and peptide coupling to carboxyl groups at the bioresist film surfaces (See: Irvine, D. J., Mayes, A. M., Griffith, L. G. *Biomacromolecules* 2001, 2, 85-94; which is incorporated herein by reference in its entirety.)

The bioresist film poly-(MMA-TBNVP) was patterned through UV lithography, where in the exposed area, the t-BOC groups were transformed into carboxyl groups. For peptide linking, 9 mg of N-(3-dimethylaminopropyl)-N'-ethylcarbodiimide hydrochloride (EDC) and 15 mg of N-hydroxysuccinimide (NHS) were dissolved in 4 mL of phosphate buffered saline (PBS), and immediately applied (1 mL per surface) to the UV patterned bioresist film. Surfaces were left in contact with the solution for 20 min at room temperature, followed by twice rinsing with 1 mL of PBS. One milliliter (mL) of RGD solution (0.5 mg/mL in PBS) was immediately applied to the surface at 4° C. for 6 hr, after which the surface was rinsed twice with PBS for 20 min per wash, then stored under PBS at 4° C. until use. The amount of peptide tethered to the surface was varied and its influence on cell attachment could be studied.

Example 6

Determination of the Amount of RGD Immobilized on the Bioresist Surface

The amount of RGD immobilized on the surface of the bioresist film poly-(MMA-TBNVP) was determined by the ninhydrin test (See: Yamaoka, T., Hotta, Y., Kobayashi, K. and Kimura, Y. *Inter J Biological Macromolecules* 1999, 25, 265-271; which is incorporated herein by reference in its entirety.) In a typical ninhydrin test, a piece of the RGD-immobilized film was immersed in a mixture of 4 N HCl (0.93 mL) and 0.9% phosphate buffer solution (PBS, 1.54 mL), and heated at 124° C. in an autoclave for 45 min. The solution was then neutralized with 3.75 N NaOH (1 mL), and 1 mL of a mixture of ninhydrin (0.6 g), hydrindantin (0.09 g), methyl cellosolve (22.5 mL), and sodium acetate buffer solution (pH 5.51, 7.5 mL) was then added to the solution. The resulting mixture was incubated in an autoclave at 124° C. for 1 min, quenched to room temperature, and examined by UV spectroscopy. The amount of amino acids in the system was determined by the absorbance at 570 nm, using a calibration curve prepared with a known amount of RGD.

Example 7

Copolymerization of N-vinyl-2-pyrrolidone (NVP) with t-butyl methacrylate (tBMA) to form poly (NVP-co-tBMA)

The polymer poly(NVP-co-tBMA) was prepared by a free radical polymerization process in sealed ampoules. In this reaction, NVP and tBMA in various ratios, along with AIBN (0.40 mmol) as an initiator, were dissolved in freshly dried THF. Polymerization was performed at 60° C. for 24 h under vacuum. After this time, the resulting polymer was precipitated twice into a solvent (hexane or water) and dried at reduced pressure. Poly(NVP-co-tBMA) was obtained as a white powder by this method, and characterized by GPC, FTIR and ¹H NMR methods, as indicated in Table 1, as polymer numbers P1 through P6.

| Polymer | Feed Ratio | | Copolymer Composition | | Yield (%) | Mn (MWD) |
| --- | --- | --- | --- | --- | --- | --- |
| | NVP | tBMA | NVP | tBMA | | |
| P1 | 0.80 | 0.20 | 0.83 | 0.17 | 89.7 | 3,616 (1.4) |
| P2 | 0.60 | 0.40 | 0.69 | 0.31 | 63.8 | 5,747 (1.4) |
| P3 | 0.40 | 0.60 | 0.59 | 0.41 | 38.0 | 7,026 (1.4) |
| P4 | 0.20 | 0.80 | 0.15 | 0.85 | 92.3 | 2,029 (3.6) |
| P5 | 1.00 | 0.00 | 1.00 | 0.00 | 55.0 | — |
| P6 | 0.00 | 1.00 | 0.00 | 1.00 | 90.0 | 3,294 (3.4) |

Example 8

Lithographic characterization of poly(NVP-co-tBMA)

The polymer poly(NVP-co-tBMA) prepared as disclosed herein was evaluated for its lithographic performance as follows. A photoresist solution was prepared by dissolving 1 g of poly(NVP-co-tBMA) and 0.1 g of TPSTf (triphenylsulfonium triflate) in 5 g of cyclohexanone. This solution was filtered prior to its application onto a silicon substrate or microscope cover glass. A resist film was prepared by spin-coating the photoresist solution on hexamethyldisilazane-treated substrates and baking the resulting product at 90° C. for 90 s. Exposure of the photoresist was carried out with a 254 nm lamp, after which the exposed wafer was baked again at 135° C. for 90 s and developed by dipping the wafer in a 2.38 wt % tetramethylammonium hydroxide (TMAH) aqueous solution for 60 s.

Figure 5:
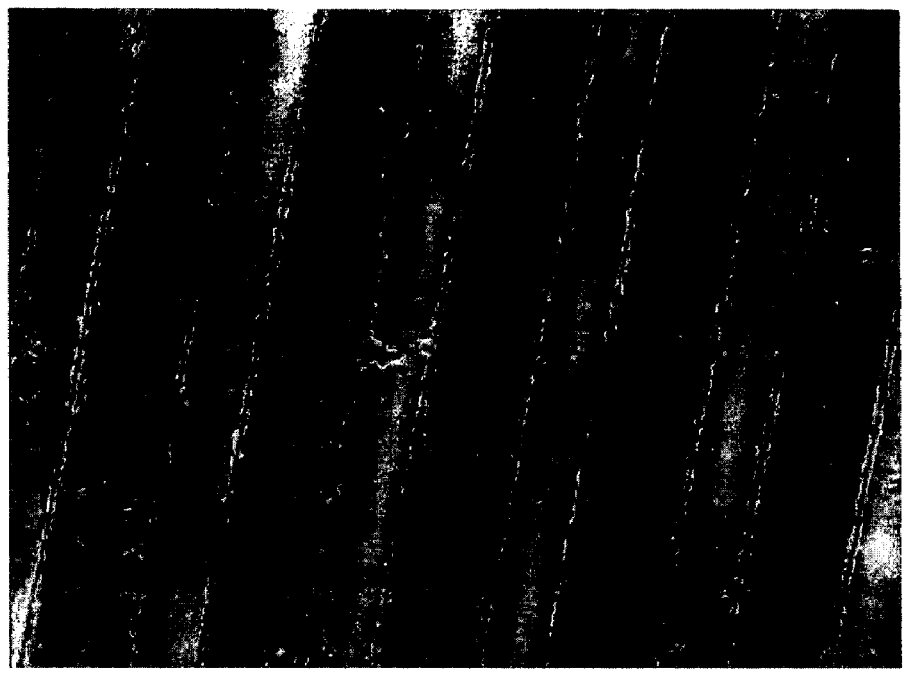
FIG. 5 provides an optical micrograph for a resist formulated with poly($NVP_{0.15}$-co-$tBMA_{0.85}$), having well-defined 25 μm line and space patterns obtained at a dose of about 5 mJ/cm², using a 254 nm lamp and 2.38 wt % TMAH aqueous solution as a developer.

FIG. 5 illustrates the optical micrographs of the line and space patterns for the resist, formulated with poly(NVP$_{0.15}$-co-tBMA$_{0.85}$), where 25 μm line and space patterns are well defined at a dose of about 5 mJ/cm².

Example 9

Preparation of 2-methylene-1,3-dioxepane (MDO) (6)

The preparation of 2-methylene-1,3-dioxepane (MDO) (6) is delineated in Jin, S. and Gonsalves, K. E. *J Mater Sci Med* 1999, 10, 363-368 and Jin, S. and Gonsalves, K. E. *Macromolecules* 1998, 31, 1010-1015, each of which is incorporated by reference in its entirety.

Example 10

Preparation of a Bioresorbable Chemically Amplified Resist (Bioresist) by Copolymerization of 2-methylene-1,3-dioxepane (MDO) (6) with Vinyl Derivative (7)

Bioresorbable CARs (bioresists) were synthesized using the ring-opening copolymerization of the monomer, 2-methylene-1,3-dioxepane (MDO) (6), as shown in Scheme 4. (See: Jin, S, and Gonsalves, K. E. *J Mater Sci Mater Med* 1999, 10, 363-368; Jin, S, and Gonsalves, K. E. *Macromolecules* 1998, 31, 1010-1015). Copolymerization of MDO (6) with the vinyl derivative (7) was performed through ring-opening copolymerization using AIBN as the initiator. The typical experimental procedures are similar to those reported in: Jin, S. and Gonsalves, K. E. *J Mater Sci Mater Med* 1999, 10, 363-368; Jin, S. and Gonsalves, K. E. *Macromolecules* 1998, 31, 1010-1015; Pan, C. Y. and Wang, Y. J. *Polym Sci Chem Ed* 1988, 26, 2737; and Matyjaszewski, K., Coessens, V., Nakagawa, Y., Xia, J., Qiu, J., Gaynor, S., Coca, S., Jasieczek. ACS Symposium Series 704, Ed. Patil, A. O., Schulz, D. N., Novak, B. M., 1997, 16-27; each of which is incorporated herein by reference in its entirety. The molar feed ratios of co-monomers (MDO:vinyl monomer, or 6:7 ratios) for preparing various copolymers were 3:1, 1:1 and 1:3, respectively. Each reaction mixture was heated neat in an oil bath at 50° C., and stirred for 48 h, after which the tubes were removed from the oil bath and various solvents such as chloroform and hexanes were added to the mixtures to dissolve or disperse the polymers. Polymers (14) were then purified through re-precipitation techniques using hexanes.

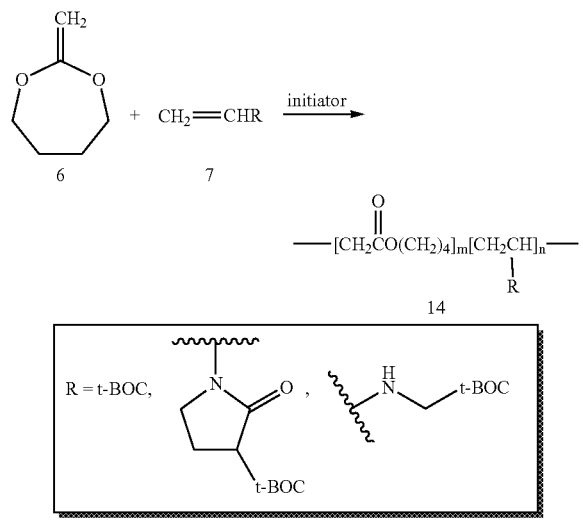

Scheme 4

Example 11

Preparation of a Bioresorbable Chemically Amplified Resist (Bioresist) Incorporating Amino Acid Sequences Amino acid sequences were incorporated into CARs as illustrated in Scheme 5, according to the typical preparative method as follows. (See: Bodanszky, M. and Bodanszky, A. The practice of peptide synthesis. Springer-Verlag, New York 1984; Perseo, G., Piani, S, and de Castiglione, R. *Int J Peptide Protein Res* 1983, 21, 227; each of which is incorporated herein by reference in its entirety.) This procedure was employed for the following amino acid sequences arginine, glycine, aspartic acid; isoleucine, lysine, valine, alanine, valine; tyrosine, isoleucine, glycine, serine, arginine. A solution of the amino acid (10 mmol) was prepared in a mixture of dioxane (20 mL), water (10 mL) and 1 N NaOH (10 mL), and this solution was stirred and cooled to around 0° C. in an ice-water bath. Di-tert-butyl pyrocarbonate (14 g, 11 mmol) was then added and stirring was continued at room temperature for 30 min. The solution was concentrated in vacuo to about 10-15 mL, cooled to around 0° C. in an ice-water bath, covered with a layer of ethyl acetate (30 mL) and acidified with a dilute aqueous solution of $KHSO_4$ to pH 2-3.

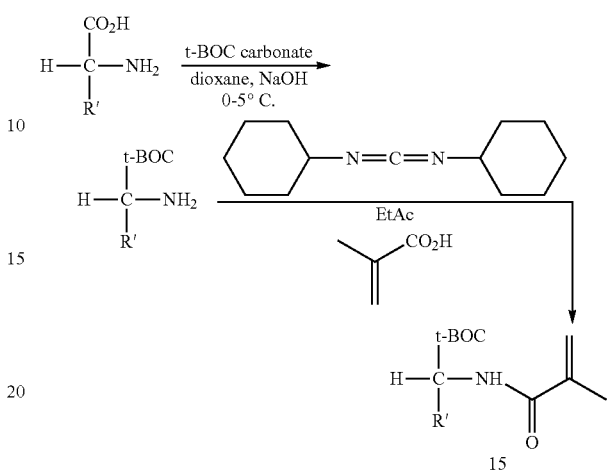

Scheme 5

The aqueous phase was then extracted twice with ethyl acetate (15 mL each). The ethyl acetate extracts were then combined and washed with water twice, 30 mL each wash, dried over anhydrous $Na_2SO_4$, and evaporated in vacuo. The residue was recrystallized with a suitable solvent such as hexane. The residue of t-butoxycarbonyl-amine and vinyl chloride was cooled to around 0° C. in an ice-water bath and stirred in the presence of dry ethyl acetate (EtAc). Freshly distilled N,N'-dicyclohexylcarbodiimide (DCC) was added while stirring. The mixture was stirred at room temperature overnight, followed by the addition of 5 mL of glacial acetic acid to decompose the excess DCC. After this mixture was cooled in ice water for 30 min, the mixture was filtered and washed thoroughly with cool 1N HCl, water, saturated $NaHCO_3$, and water. The solution was then dried over anhydrous $Na_2SO_4$ and solvent was removed under reduced pressure. A precipitate was obtained upon addition of acetone. Product (15) was then recrystallized in hexane for characterization. This procedure was used for compounds 15, $CH_2CMeCONHCHR'$-t-BOC, wherein R' can be H—, $CH_3$—, $(CH_3)_2CH$—, or $PhCH_2$—.

Example 12

Preparation of an Amino Acid-containing Bioresorbable CAR (Bioresist) by Homopolymerization of $CH_2CMeCONHCHR'$-t-BOC (15)

The amino acid residue-containing monomer $CH_2CMeCONHCHR'$-t-BOC (15) (where R'can be H—, $CH_3$—, $(CH_3)_2CH$—, or $PhCH_2$—) was homopolymerized using AIBN as the initiator, according to the same method disclosed herein for the copolymerization of MDO (6) and vinyl derivative (7), using AIBN as the initiator. Typical experimental procedures are reported in: Jin, S. and Gonsalves, K. E. *J Mater Sci Mater Med* 1999, 10, 363-368; Jin, S. and Gonsalves, K. E. *Macromolecules* 1998, 31, 1010-1015; Pan, C. Y. and Wang, Y. J. *Polym Sci Chem Ed* 1988, 26, 2737; and Matyjaszewski, K., Coessens, V., Nakagawa, Y., Xia, J., Qiu, J., Gaynor, S., Coca, S., Jasieczek. ACS Symposium Series 704, Ed. Patil, A. O., Schulz, D. N., Novak, B. M., 1997, 16-27; each of which is incorporated herein by reference in its entirety. These amino acid-based materials were biocompatible as well as resorbable. In addition, these amino acid-based monomers were homopolymerized or copolymerized with MDO or TBNVP, or terpolymerized with MDO and TBNVP, to obtain optimum physical and mechanical properties.

Example 13

Preparation of an Amino Acid-containing Bioresorbable CAR (Bioresist) by Copolymerization of CH$_2$CMeCONHCHR'-t-BOC (15)

The amino acid-containing monomer CH$_2$CMeCONHCHR'-t-BOC (15) was copolymerized with 2-methylene-1,3-dioxepane (MDO) (6), 3-(t-butoxycarbonyl)-N-vinyl-2-pyrrolidone (TBNVP) (1), or vinyl derivative (7), using AIBN as the initiator, according to the same method disclosed herein for the copolymerization of MDO (6) and vinyl derivative (7), using AIBN as the initiator. Typical experimental procedures are reported in: Jin, S. and Gonslaves, K. E. *J Mater Sci Mater Med* 1999, 10, 363-368; Jin, S. and Gonslaves, K. E. *Macromolecules* 1998, 31, 1010-1015; Pan, C. Y. and Wang, Y. J. *Polym Sci Chem Ed* 1988, 26, 2737; and Matyjaszewski, K., Coessens, V., Nakagawa, Y., Xia, J., Qiu, J., Gaynor, S., Coca, S., Jasieczek. ACS Symposium Series 704, Ed. Patil, A. O., Schulz, D. N., Novak, B. M., 1997, 16-27; each of which is incorporated herein by reference in its entirety.

More complex, amino acid-containing bioresorbable CARs, which are biocompatible as well as resorbable, could also be prepared as follows. Terpolymerization reactions with CH$_2$CMeCONHCHR'-t-BOC (15) could be undertaken using any combination of 2-methylene-1,3-dioxepane (MDO), 3-(t-butoxycarbonyl)-N-vinyl-2-pyrrolidone (TBNVP), or vinyl derivative, in which AIBN is employed as the initiator, according to the same method, to obtain optimum physical and mechanical properties. These materials should be biocompatible as well as resorbable.

Example 14

Preparation of Crosslinker Molecule 16

The preparation of a crosslinker molecule 16 is provided in Scheme 6 as reported by Bruining, M. J.; Edelbroek-Hoogendoom, P.S., Blaauwgeers, H. G. T., Mooy, C. M., Hendrikse, F. H. and Koole, L. H. *J Biomed Mater Res* 1999, 47, 189-197, which is incorporated herein by reference in its entirety. The core of this molecule contains two carbonate groups, which are susceptible to hydrolytic scission, and therefore are more biocompatible and resorbable that poly(lactic acid)- or poly(D,L-lactide-co-glycolide acid)-based materials.

Example 15

Preparation of Crosslinked Bioresorbable CARs Incorporating 2-methylene-1,3-dioxepane (MDO) (6)

Crosslinked 3-dimensional (3-D) type structures such as 10 can be prepared by copolymerizing 2-methylene-1,3-dioxepane (MDO) (6) with 7, 8, or a combination of 7 and 8, along with a diolefinic crosslinker molecule of the general form 9, as illustrated in Scheme 3. These components could be thermally or photochemically synthesized using an initiator as appropriate, according to standard methods known to one of ordinary skill. Typical experimental procedures are reported in: Jin, S. and Gonslaves, K. E. *J Mater Sci, Mater Med* 1999, 10, 363-368; Jin, S. and Gonslaves, K. E. *Macromolecules* 1998, 31, 1010-1015; Pan, C. Y. and Wang, Y. J. *Polym Sci Chem Ed* 1988, 26, 2737; and Matyjaszewski, K., Coessens, V., Nakagawa, Y., Xia, J., Qiu, J., Gaynor, S., Coca, S., Jasieczek. ACS Symposium Series 704, Ed. Patil, A. O., Schulz, D. N., Novak, B. M., 1997, 16-27; each of which is incorporated herein by reference in its entirety. Further, the resulting crosslinked structures could have controlled crosslinking density to impart varying degrees of mechanical stability, from flexibility to high rigidity, as well as varying degrees of swelling characteristics in aqueous media. The controlled crosslinking density is based on the amount of compound 9 used in the polymerization. Further, the 3-D structure itself can be photolithographically patterned since it contains the t-BOC monomers 7, 8, or a combination thereof.

Example 16

Alternative Preparation of a Bioresorbable CAR

An alternative route to bioresorbable CARs (bioresists) is presented in Schemes 7 and 8. Cyclic monomer compounds 17 and 20 were copolymerized by ring-opening polymerization (ROP) in the presence of stannous octoate initiator, as reported by Bruining, M. J., Edelbroek-Hoogendoorn, P.S., Blaauwgeers, H. G. T., Mooy, C. M., Hendrikse, F. H. and Koole, L. H. *J Biomed Mater Res* 1999, 47, 189-197, which is incorporated herein by reference in its entirety. As shown in Scheme 4, the benzyl ester can be easily removed by hydrogenolysis using palladium on charcoal (Pd/C) as the catalyst, thus the composition of the functional groups in the copolymers can be controlled. The ROP polymerization of these cyclic monomers (17 and 20) provided materials with pendent —COOH groups (18 and 21). Some of these —COOH groups were protected with t-BOC groups while some car- Scheme 6

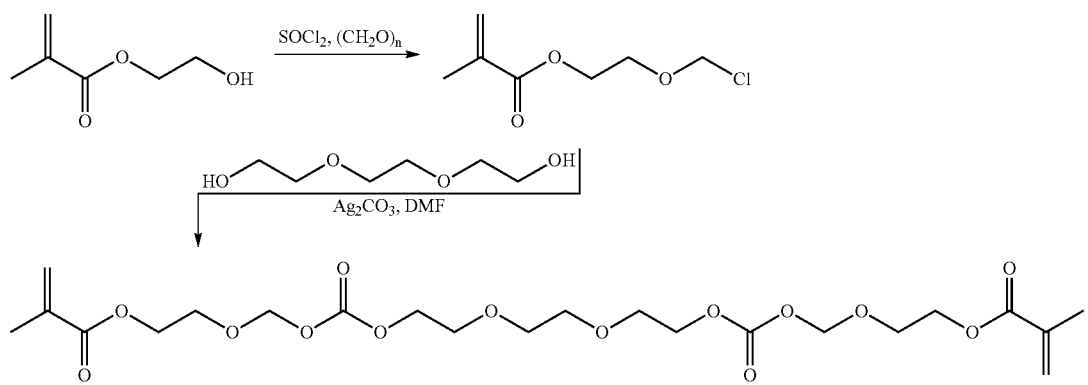

boxyl groups were retained to promote adhesion with the substrate. The introduction of t-BOC groups has been schematically shown in the reaction schemes and examples presented herein. Thus CA Bioresist materials (19 and 22) were also prepared.

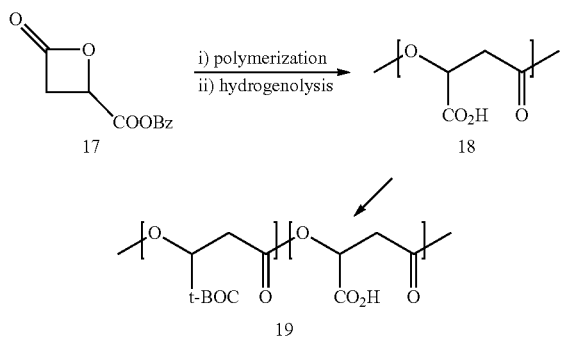

Scheme 7

Scheme 8

Bz = CH$_2$Ph

Example 17

Fabrication of Patterned Two-Dimensional (2-D) Structures

The t-BOC containing bioresist materials synthesized in the Examples and Schemes disclosed herein were tested for their lithographic performance using various projection lithographic process (365 nm, DUV, and 193 nm), according to the following general procedure.

1. Bioresist solutions were prepared in propylene glycol methyl ether (PGME) wherein 10% by weight of polymer was in PGME and 2-10% by weight of a photoacid generator (PAG) was added.
2. The resulting solution was filtered and a resist film was obtained by spinning the solution on a clean glass slide at 1500 rpm for 1 min.
3. The film was then baked on a hot plate at 120° C. for 1 min to remove the solvent in a post application bake (PAB).
4. The resulting film was exposed to the UV source through a mask and then post exposure baked (PEB) at 120° C. for 1 min. Images obtained in this manner were examined under an inverted optical microscope.

This method does not require a subsequent post-development step using strong bases to obtain the desired features on the bioresists, thereby rendering this process highly desirable for direct cell and protein patterning. Alternative PAGs such as 2-nitrobenzylester of sulfonic acid and its derivatives were also used. See, for example: Ahn, K. D., Koo, J. S. and Chung, C. M. *J Polym Sci Polym Chem Ed* 1996, 34, 183; Thackeray, J. W., Adams, T., Cronin, M. F., Denison, M., Fedynyshyn, T. H., Georger, J., Mori, J. M., Orsula, G. W. and Sinta, R. *J Photopolym Sci Technol* 1994, 7, 619-630; Ito, H., Breyta, G., Hofer, D., Fisher, R. and Prime, B. *Proc SPIE* 1995, 2438, 53-60; Ito, H., Breyta, G., Sooriyakumaren, R. and Hofer, D. *J Photopolym Sci Technol* 1995, 8, 505-518; each of which is incorporated herein by reference in its entirety.

Example 18

Fabrication of Patterned Three-Dimensional (3-D) Structures—Method 1 (FIG. 6)

As presented in Example 15, crosslinked 3-dimensional (3-D) type structures such as 10 were prepared by copolymerizing 2-methylene-1,3-dioxepane (MDO) (6) with 7, 8, or a combination of 7 and 8, along with a diolefinic crosslinker molecule of the general form 9, as illustrated in Scheme 3.

During the crosslinking reaction, subsequent to initiation by a low temperature process such as photopolymerization, additional azobisisobutronitrile (AIBN) was added [5 to 10 wt %] or alternatively, CO$_2$ was bubbled into the reactor. The system was then heated so that the N$_2$ gas evolved by the decomposition of the AIBN initiator acts as a blowing agent to form a cellular, three dimensional foam structure, as illustrated in FIG. 6. Because these structures contain t-BOC groups, they permit patterning of the "top" surfaces of the foam.

Example 19

Fabrication of Patterned Three-Dimensional (3-D) Structures—Method 2 (FIG. 7)

A glass substrate with pillared arrays was fabricated through etching techniques, such as those disclosed in Moreau, W. M. *Semiconductor Lithography: Principles, Practices, and Materials*, Plenum, New York, 1987; which is incorporated herein by reference in its entirety. This glass substrate comprising pillared arrays was used as a temporary substrate. A biodegradable and biocompatible polymer, including, but not limited to, one of the biodegradable and biocompatible polymers disclosed herein, for example, the polymer disclosed in Examples 3-5, 7, 10, or 11 was coated onto the glass substrate, and cured using either a thermal or a UV polymerization technique as required. A second coating of a bioresist polymer was spin-cast onto the first cured polymeric surface on the top of the glass substrate at 1500 rpm for 1 min, baked (PAB) on a hot plate at 120° C. for 1 min to remove the solvent, exposed to UV lamp (wavelength: 365 nm) for 2 min, using a UV mask (umxum), and then post-exposure baked (PEB) at 120° C. for 1 min to reveal the images on the top. This second layer of bioresist materal can be, for example, the polymer disclosed in Examples 3-5, 7, 10, or 11.

The fabricated device was peeled off the glass substrate to provide a free-standing 3-D structure with controlled pore sizes, as illustrated in FIG. 7, based on the dimensions of the UV mask. Bioresists prepared in this manner, in which substrates were directly patterned by lithography, can then be used for cell alignment and fabrication of 3-D tissue scaffolds.

Example 20

Fabrication of Patterned Three-Dimensional (3-D) Structures—Method 3 (FIG. 8)

Patterned layers prepared according to Example 19 were seeded with cells and then laid on top of each other sequentially so that a biomimetic-type structure was obtained. The layers were then soldered using one of the photochemically-active polymers synthesized above. Thermal annealing is an alternative method by which to solder the layers. In both instances, chemcial crosslinking combined with thermoplastic reflow of the polymers will provide chain entanglement.

The soldering was restricted to the outer edges of the scaffold, using a fiber optic cable with a UV laser source (30 W/cm$^2$, Lightwave Energy System Co. Torrance Calif.) to afford the free-standing 3-D biomaterial, as illustrated in FIG. 8.

Example 21

Biomechanical Testing

Biomechanical testing consisted of a series of uniaxial tension tests on 1 cm×7 cm specimens. Testing was conducted using a tensiometer (MTS Sintech 2/S, Polymer Center of Excellence, Charlotte, N.C.). In all cases, the applied displacement rate was 5-10 mm/min. An environmental chamber was utilized to provide proper specimen hydration during the testing.

Each specimen was tested to obtain tensile strength, modulus of elasticity, and strain at failure at the required environmental setting. Thereafter, each material was tested at 3 time periods in culture media, both with and without cell seeding. Each material was then harvested from the subcutaneous space of rats and tested at 4 time periods.

For data analysis, raw data for biomechanical tests consisted of load versus displacement curves for each test. Specimens' load-displacement curves were obtained and from this data, information concerning the elastic behavior of the materials porous structure was obtained. Stress and strain data were determined from the load and displacement data by dividing the individual specimen's initial cross-sectional area and gage length, respectively. Stiffness, as measured by the modulus of elasticity, was calculated by the slope of the linear elastic region of each specimen's stress-strain curve. Ultimate (that is, maximal) stress and strain at failure also came directly from the stress-strain data. The data generated from these experiments provided information regarding the usefulness of these materials for various tissue engineering applications.

Mechanical data of this type was used to tailor specific mechanical properties into the material in order to either increase its tensile strength for applications such as tendon (See: Maganaris C. N. *J Biomech* 2002 35, 1019-1027; which is incorporated herein by reference in its entirety) or hernia repaire (See: Korenkov, M., Beckers, A., Koebke, J., Lefering, R., Tiling, T. and Troidl, H. *Eur J Surg* 2001, 167, 909-914; Lipton, S., Estrin, J. and Nathan, I. *J Am Coll Surg* 1994, 178, 595-599; each of which is incorporated herein by reference in its entirety) or to reduce its stiffness for applications such as soft tissue repair (See: Storch, M., Perry, L. C, Davidson, J. M. and Ward, J. J. *Surg Infect* (Larchmt) 2002, 3 Suppl 1, 89-98; Kirby, S. D., Wang, B., To, C. W. and Lampe, H. B. *J Otolaryngol* 1998, 27, 153-160; each of which is incorporated herein by reference in its entirety) or construction of organs (See: Stingl, J., Baca, V., Cech, P., Kovanda, J., Kovandova, H., Mandys, V., Rejmontova, J. and Sosna, B. *Surg Radiol Anat* 2002, 24, 285-289; which is incorporated herein by reference in its entirety).

Example 22

Preparation of poly(t-Boc-pyrrole-co-amidopyrrole) bioelectroactive resist (Scheme 9)

The t-butoxycarbonyl pyrrole, monomer 24 of Scheme 9, was synthesized from 3-acetic acid pyrrole (23) by treatment with t-butoxycarbonyl chloride in THF under reflux, according to the method of Godillot, P., Korri-Youssoufi, H., Srivastava, P., El Kassmi, A., and Garnier, F., *Synth. Met.,* 83, p. 117, (1997) and Shastri, V., Rahaman, N., Martin, I., and Langer, R.; *Mater. Res., Soc. Symp. Proc.* 550, p. 215, (1999), each of which is incorporated herein by reference in its entirety. Monomer 25, 3-acetate N-hydroxysuccenimido pyrrole, was prepared from 23 and N-hydroxy succinimide (NHS) by using coupling agent N,N'-dicyclohexocarbodiimide (DCC) in chloroform under ambient conditions.

The monomers 3-acetate N-hydroxysuccenimido pyrrole (25) and t-butoxycarbonyl pyrrole (24) were polymerized by chemical oxidative techniques as follows. The monomers were dissolved in acetonitrile. To this mixture, excess ferric chloride in acetonitrile was added and stirred vigorously for about 30 min, after which time this mixture was poured into a large volume of ice water. The obtained polymer precipitate (compound 26) was washed with cold water and dried in vacuum for characterization and for covalently attaching the appropriate peptide segments (for example, IKVAV (SEQ ID NO: 1), YIGSR (SEQ ID NO: 2), and the like) to form structure 27, poly(t-Boc-pyrrole-co-amidopyrrole), as shown in Scheme 9.

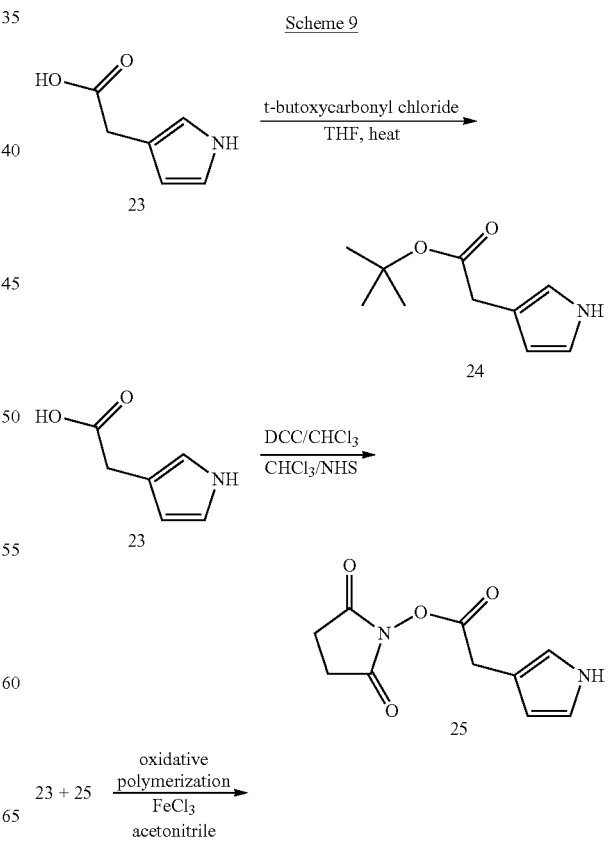

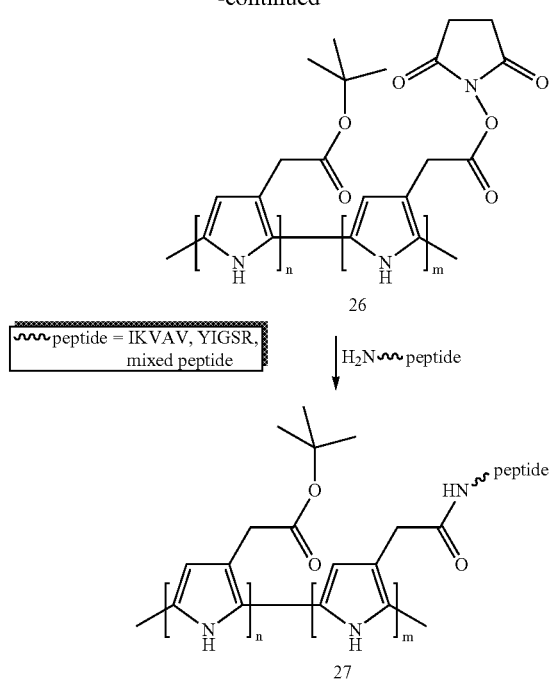

Example 23

Preparation of poly(t-Boc-pyrrole-coblock-esteramidopyrrole) (Scheme 10)

An excess of N-(3-aminopropyl)pyrrole (28) was reacted with a diacid chloride (28 in Scheme 10) to form a telechelic oliogomer (30) with pyrrole end groups. The diacid chloride itself consists of a block of an esteramide, also as shown in Scheme 10. These blocks were prepared based on our previous synthesis of esteramide containing amino acids (See: Gonsalves, K. E. and Mungara, P. M., TRIP, 4(1), p. 25, (1996)). Oligomer 30 was then chemically co-polymerized with 31, resulting in the target bioresist poly(t-Boc-pyrrole-coblock-esteramidopyrrole) (32). Bioresist 32, upon exposure to UV or EB radiation in the presence of photoacid generator (PAG), triarylsulfonium hexafluoroantimonate, resulted in the deblocking of t-Boc groups to carboxylic groups and formation of 33. These carboxylic groups could subsequently be attached with peptide segments as previously demonstrated in examples 5 and 6.

The chemical spacers in scheme, generally represented as "L", could be selected from from $(CH_2)_n$, $(CH_2)_nOC(O)(CH_2)_m$, $(CH_2)_nOC(O)(CH_2)_mC(O)O(CH_2)_n$, $CHRNHC(O)(CH_2)_nC(O)NHCHR$, $(CH_2)_nNHC(O)(CH_2)_m$, or any combination thereof; wherein n is independently selected from an integer from 1 to about 12; m is independently selected from an integer from 1 to about 12; and R is independently selected from H, hydrocarbyl having from 1 to about 12 carbon atoms, or an amino acid residue.

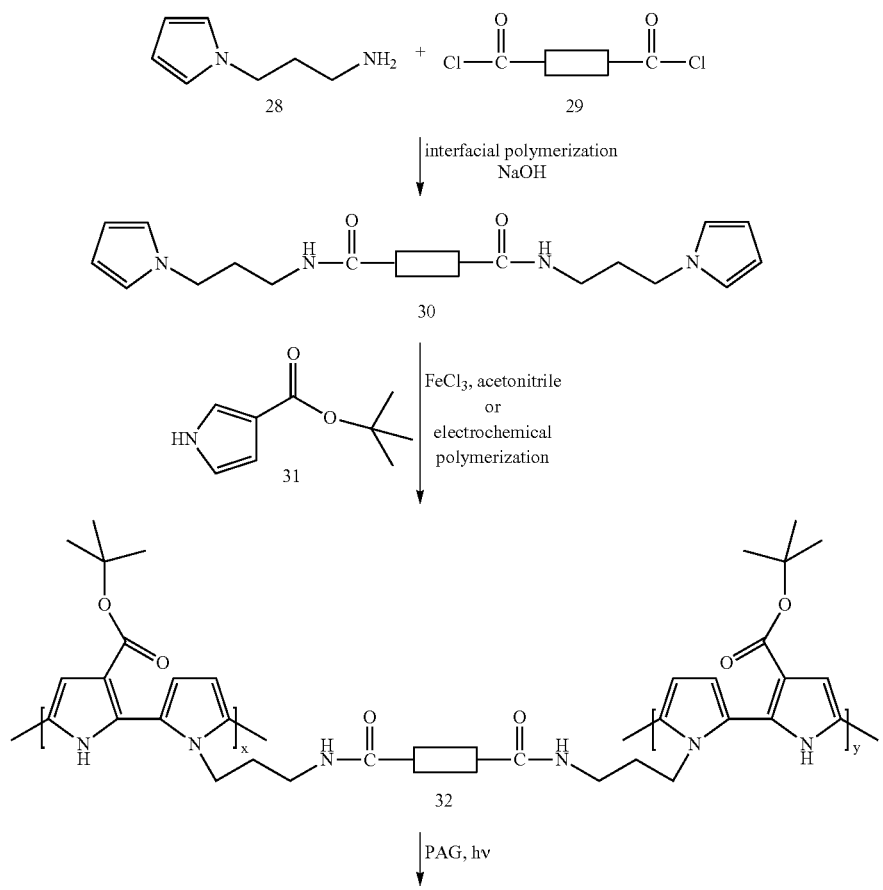

Scheme 10

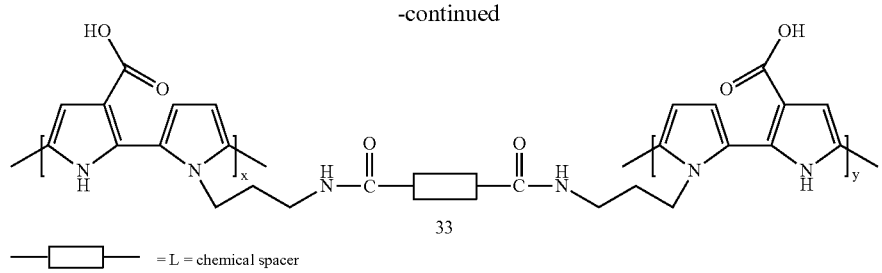

= L = chemical spacer

Example 24
Preparation of poly(t-Boc-pyrrole-co-amido pyrrole) (36) (Scheme 11)

As illustrated in Scheme 11, resist polymer 36, poly(t-Boc-pyrrole-co-amido pyrrole), incorporates a direct amide linkage, rather then the block amidoester segments employed in polymer 32. Accordingly, compounds 28 and 34 in the presence of acid catalyst (p-toluenesulfonic acid) in methylene chloride solvent produced amidopyrrole compound 35. The latter was copolymerized with t-butoxycarbonyl pyrrole, monomer 31 using excess ferric chloride, in the oxidative polymerization shown in Scheme 11.

Scheme 11

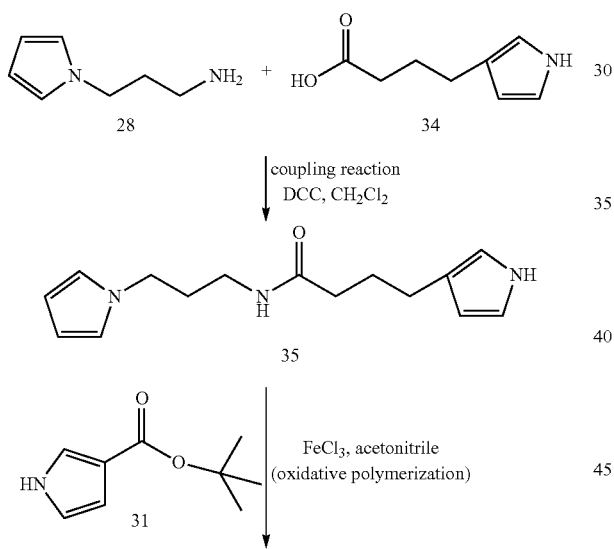

-continued

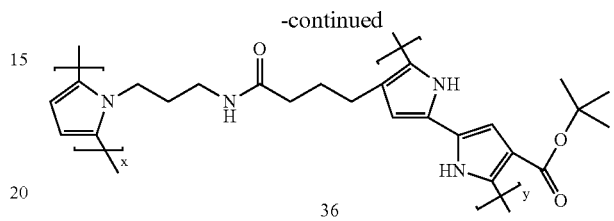

Example 25
Preparation of poly(t-Boc-MMA-co-MDO-PMTM) (39) (Scheme 12)

The amino functionalized thiophene oligomer 37 was prepared as illustrated in Scheme 12, and as reported in Darrrick, S. H., Kim, L., Curtis, L., Ashendel, Zhou, Q., Chang, C., Lee, E. S., and Chang, C. J., *Bioorganic and Medicinal Chemistry letter*, 8, p. 2695, (1998), which is incorporated herein by reference in its entirety. Oligomer 37 can be coupled with methyl methacrylic acid (MMA) with DCC(N,N'-dicyclohexocarbodiimide), resulting in monomer 38. Terpolymerization of 38, 2-methylene-1,3-dioxepane, (MDO) and t-Boc-MMA produces polymer 39, as shown in Scheme 12.

Scheme 12

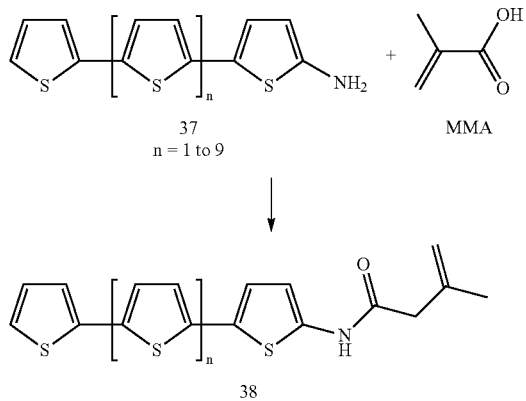

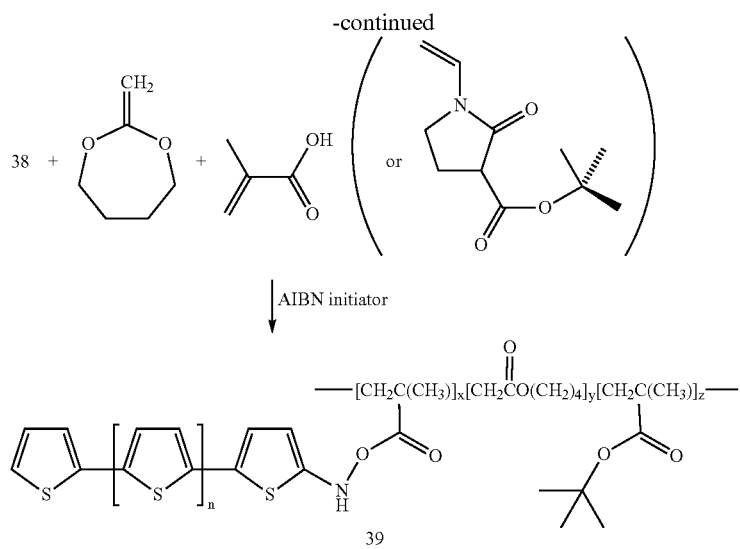

We claim:

1. A chemically-amplified resist composition comprising a substrate and a polymerization product on a surface of the substrate, the polymerization product comprising:
   a pyrrolidone component comprising deprotected 3-(t-butoxycarbonyl)-N-vinyl-2-pyrrolidone monomer comprising a carboxyl group;
   an optional methacrylate component comprising at least one methacrylate-containing monomer; and
   a photoacid generator component comprising at least one photoacid generator-containing monomer,
   wherein the polymerization product is functionalized with a peptide at the carboxyl group of the pyrrolidone-containing monomer, the peptide comprising a tripeptide Arg-Gly-Asp (RGD).

2. The chemically-amplified resist of claim 1, wherein the photoacid generator component comprises [p-CH$_2$=C(CH$_3$)C(O)OC$_6$H$_4$SMe$_2$]OSO$_2$CF$_3$.

3. The chemically amplified resist composition of claim 1, wherein the pyrrolidone component further comprises N-vinyl-2-pyrrolidone, 3-(t-butoxycarbonyl)-N-vinyl-2-pyrrolidone or combinations thereof.

4. A chemically-amplified resist composition comprising a substrate and a polymerization product on a surface of the substrate, the polymerization product comprising:
   a pyrrolidone component comprising at least one pyrrolidone-containing monomer selected from the group consisting of N-vinyl-2-pyrrolidone, 3-(t-butoxycarbonyl)-N-vinyl-2-pyrrolidone, or deprotected 3-(t-butoxycarbonyl)-N-vinyl-2-pyrrolidone;

an optional methacrylate component comprising at least one methacrylate-containing monomer;
a photoacid generator component comprising at least one photoacid generator-containing monomer; and
an amino acid component comprising at least one compound of the formula

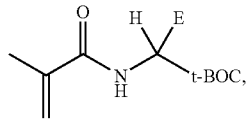

wherein E is selected from $R^1$, $OR^1$, $SR^1$, or $NR^1_2$; wherein $R^1$ is selected from a linear or branched hydrocarbyl having from 1 to about 30 carbon atoms; or hydrogen.

5. The chemically-amplified resist of claim 4, wherein the photoacid generator component comprises [p-$CH_2$=$C(CH_3)$$C(O)OC_6H_4SMe_2$]$OSO_2CF_3$.

6. A chemically-amplified resist composition comprising a substrate and a polymerization product on a surface of the substrate, the polymerization product comprising:

a pyrrolidone component comprising at least one pyrrolidone-containing monomer selected from the group consisting of N-vinyl-2-pyrrolidone, 3-(t-butoxycarbonyl)-N-vinyl-2-pyrrolidone, or deprotected 3-(t-butoxycarbonyl)-N-vinyl-2-pyrrolidone;
an optional methacrylate component comprising at least one methacrylate-containing monomer;
a photoacid generator component comprising at least one photoacid generator-containing monomer; and
an amino acid component comprising at least one compound of the formula

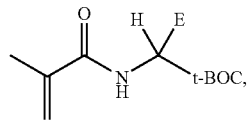

wherein E is an amino acid residue.

* * * * *

SEQUENCE LISTING

<160> NUMBER OF SEQ ID NOS: 2

<210> SEQ ID NO 1
<211> LENGTH: 5
<212> TYPE: PRT
<213> ORGANISM: Artificial Sequence
<220> FEATURE:
<223> OTHER INFORMATION: Designed peptide based on size and polarity to
      provide cell adhesion and/or other biologically relevant
      properties.

<400> SEQUENCE: 1

Ile Lys Val Ala Val
1               5

<210> SEQ ID NO 2
<211> LENGTH: 5
<212> TYPE: PRT
<213> ORGANISM: Artificial Sequence
<220> FEATURE:
<223> OTHER INFORMATION: Designed peptide based on size and polarity to
      provide cell adhesion and/or other biologically relevant
      properties.

<400> SEQUENCE: 2

Tyr Ile Gly Ser Arg
1               5